(12) United States Patent
Sniegowski et al.

(10) Patent No.: US 6,989,582 B2
(45) Date of Patent: Jan. 24, 2006

(54) METHOD FOR MAKING A MULTI-DIE CHIP

(75) Inventors: Jeffry Joseph Sniegowski, Tijeras, NM (US); Murray Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/456,319

(22) Filed: Jun. 6, 2003

(65) Prior Publication Data
US 2003/0197248 A1 Oct. 23, 2003

Related U.S. Application Data

(62) Division of application No. 10/099,139, filed on Mar. 16, 2002, now abandoned.

(51) Int. Cl.
*H01L 23/544* (2006.01)
(52) U.S. Cl. ............... 257/620; 438/113; 438/458; 438/462
(58) Field of Classification Search ............ 438/22–47, 438/106–132, 142–378, 400–757, 68; 257/499–564, 257/618–628, 661–786
See application file for complete search history.

(56) References Cited

U.S. PATENT DOCUMENTS

| | | | |
|---|---|---|---|
| 4,866,508 A | 9/1989 | Eichelberger et al. | 357/74 |
| 4,904,073 A | 2/1990 | Lawton et al. | 350/613 |
| 4,907,062 A | 3/1990 | Fukushima | 375/75 |
| 5,055,383 A | 10/1991 | Koblinger et al. | 430/312 |
| 5,301,124 A | 4/1994 | Chan et al. | 364/490 |
| 5,519,629 A | 5/1996 | Snider | 364/490 |
| 5,587,923 A | 12/1996 | Wang | 364/490 |
| 5,597,767 A * | 1/1997 | Mignardi et al. | 438/14 |
| 5,648,661 A * | 7/1997 | Rostoker et al. | 257/48 |
| 5,702,963 A | 12/1997 | Vu et al. | 437/41 GS |
| 5,705,320 A | 1/1998 | Hsu et al. | 430/313 |
| 5,783,340 A * | 7/1998 | Farino et al. | 430/22 |
| 5,835,378 A | 11/1998 | Scepanovic et al. | 364/468.28 |
| 5,856,101 A | 1/1999 | Hubbell et al. | 435/6 |
| 5,959,354 A * | 9/1999 | Smith et al. | 257/734 |
| 5,990,540 A | 11/1999 | Yokoya | 257/620 |
| 5,998,868 A * | 12/1999 | Pogge et al. | 257/730 |
| 6,001,723 A * | 12/1999 | Kelkar et al. | 438/612 |
| 6,003,223 A | 12/1999 | Hagen et al. | 29/603.12 |
| 6,005,649 A | 12/1999 | Krusius et al. | 349/73 |
| 6,051,866 A * | 4/2000 | Shaw et al. | 257/417 |
| 6,091,620 A | 7/2000 | Kablanian | 365/63 |
| 6,291,894 B1 * | 9/2001 | Farnworth et al. | 257/780 |
| 6,538,301 B1 | 3/2003 | Yamada et al. | |
| 6,586,831 B2 * | 7/2003 | Gooch et al. | 257/704 |
| 6,605,861 B2 * | 8/2003 | Toyoda | 257/620 |
| 6,627,917 B1 | 9/2003 | Fenner et al. | 257/48 |
| 2001/0001502 A1 * | 5/2001 | Wong | 257/620 |
| 2002/0014682 A1 * | 2/2002 | Sakai et al. | 257/620 |

\* cited by examiner

OTHER PUBLICATIONS

U.S. Appl. No. 10/099,139, filed Mar. 16, 2002, Sniegowski et al.

*Primary Examiner*—Hoai Pham
*Assistant Examiner*—Nathan W. Ha
(74) *Attorney, Agent, or Firm*—Marsh Fischmann & Breyfogle LLP

(57) ABSTRACT

The present invention generally relates to a die perimeter region of a die having a microelectromechanical assembly fabricated thereon. This die perimeter region may be configured to facilitate electrically interconnecting adjacent die on a wafer. Moreover, this die perimeter region may be configured to facilitate separating the die from a wafer.

21 Claims, 16 Drawing Sheets

METHOD FOR MAKING A MULTI-DIE CHIP

CROSS-REFERENCE TO RELATED APPLICATIONS

This patent application is a divisional of, and claims priority under 35 U.S.C. §120 to, U.S. patent application Ser. No. 10/099,139, now abandoned, that was filed on Mar. 16, 2002, and that is entitled "MULTI-DIE CHIP AND METHOD FOR MAKING THE SAME", the entire disclosure of which is incorporated by reference in its entirety herein.

FIELD OF THE INVENTION

The present invention generally relates to a chip that is defined by a plurality of die, with each die including a microelectromechanical assembly, and, more particularly, to a configuration of a die perimeter region that facilitates having a multi-chip die.

BACKGROUND OF THE INVENTION

There are a number of microfabrication technologies that have been utilized for making microstructures (e.g., micromechanical devices, microelectromechanical devices) by what may be characterized as micromachining, including LIGA (Lithography, Galvonoforming, Abforming), SLIGA (sacrificial LIGA), bulk micromachining, surface micromachining, micro electrodischarge machining (EDM), laser micromachining, 3-D stereolithography, and other techniques. Bulk micromachining has been utilized for making relatively simple micromechanical structures. Bulk micromachining generally entails cutting or machining a bulk substrate using an appropriate etchant (e.g., using liquid crystal-plane selective etchants; using deep reactive ion etching techniques). Another micromachining technique that allows for the formation of significantly more complex microstructures is surface micromachining. Surface micromachining generally entails depositing alternate layers of structural material and sacrificial material using an appropriate substrate (e.g., a silicon wafer) which functions as the foundation for the resulting microstructure. Various patterning operations (collectively including masking, etching, and mask removal operations) may be executed on one or more of these layers before the next layer is deposited so as to define the desired microstructure. After the microstructure has been defined in this general manner, the various sacrificial layers are removed by exposing the microstructure and the various sacrificial layers to one or more etchants. This is commonly called "releasing" the microstructure from the substrate, typically to allow at least some degree of relative movement between the microstructure and the substrate.

It has been proposed to fabricate various types of optical switch configurations using various micromachining fabrication techniques. One of the issues regarding these types of optical switches is the number of mirrors that may be placed on a single die. A die is commonly referred to as that area defined by one field of a stepper (or contact aligner in some instances) that is utilized to lay out the die. In the case of a stepper, die size is generally limited to the maximum optical field size of the stepper, which is typically less than or on the order of 30 mm or so depending on the specific stepper being used. Reducing the size of the mirrors in order to realize the desired number of mirrors on a die may present various types of issues. For instance, there are of course practical limits as to how small the mirrors can be fabricated, or more limiting is the minimum acceptable size of the micromirrors for the optical application, which thereby limits the number of ports for the optical switch for a given die size. Therefore, it may not be possible to fabricate an optical switch with a certain number of ports using a single die. Moreover, as smaller and denser microstructures are incorporated on a die, impact on chip yield may become more and more of an issue. For instance, a microelectromechanical optical switch may be rendered defective during the handling of a chip on which the switch is fabricated as the size of the various microstructures is reduced, and the chip area is increased.

SUMMARY OF THE INVENTION

A first aspect of the present invention generally relates to a desired configuration of what may be characterized as a die boundary region, namely that region on a die that borders the various microstructures of a microelectromechanical assembly that is fabricated on the die. For instance, this die boundary region may be in the form of an inter-die region between adjacent die, including without limitation between adjacent die on a wafer, chip, or the like. However, this die boundary region may be located on a perimeter of a chip or an individual die as well. Generally, the noted die boundary region is devoid of an oxide layer that is typically disposed between a dielectric layer and a substrate that is used in the fabrication of the microelectromechanical assembly on the die. However, those portions of the die that are disposed inwardly out of the die boundary region include an oxide layer between the dielectric layer and the substrate. Generally, a "dielectric layer" refers to a layer/film that is made up of one or more non-sacrificial and non-etchable materials. By contrast, an "oxide layer" generally refers to a layer/film that is made up of a material that is at least potentially etchable during a release etching step of a chip fabrication process. One advantage of this configuration is that a perimeter region of the chip/die will be suitable for engagement by handling equipment. Another advantage of this configuration is that die may be sawed or otherwise separated along a die boundary region, and subsequent exposure of the chip/die to a release etchant should not cause any portion of the oxide layer that is located between the dielectric layer and the substrate to be exposed to a release etchant. Any exposure of this oxide layer may produce an undesired undercut cantilevering the dielectric layer and resulting in an undesired structural instability or increased susceptibility to breakage for perimeter structures. Yet another advantage is that fabricating each inter-die region in this manner may allow a wafer to be fabricated in a manner such that a chip of any desired die size may be produced therefrom.

The first aspect of the present invention is embodied by a chip that includes a substrate, an oxide layer, and a dielectric layer. The oxide layer overlies the substrate, while the dielectric layer overlies the oxide layer. The chip further includes a plurality of die. Each die includes a die perimeter region and a device region that is disposed inwardly of the corresponding die perimeter region. The device region of each die includes a first microelectromechanical assembly such that the chip may be properly characterized as having a plurality of first microelectromechanical assemblies. The oxide layer is disposed between the dielectric layer and the substrate in the device region of each of the die of the chip. This oxide layer may generally provide a function (among others) of supplying an additional electrical isolation layer (in addition to the dielectric layer) to the structure of the chip to further electrically isolate the substrate from the plurality of first microelectromechanical assemblies disposed on the device region of each die. However, the die perimeter region of each die is devoid of the oxide layer such that the dielectric layer is disposed directly on the substrate in each die perimeter region.

Various refinements exist of the features noted in relation to the subject first aspect of the present invention. Further features may also be incorporated in the subject first aspect of the present invention as well. These refinements and additional features may exist individually or in any combination. Representative substrates that may be utilized by the first aspect include silicon, as well as any other appropriate chip substrate such as gallium arsenide (GaAs), gallium arsenide phosphide (GaAsP), ceramics, or other appropriate compound semiconductor substrates. Representative oxides that may be utilized by the first aspect include silicon dioxide, silicon oxynitrides, and any other appropriate oxides. Representative dielectric materials that may be utilized by the first aspect include silicon nitride, silicon carbide, and any other appropriate dielectric material.

The lack of an oxide layer in the die perimeter region of each die of the chip of the first aspect provides a number of advantages in addition to preventing cantilevered dielectric layers subsequent to separation of the chip from the wafer and during and/or after a release etching step of a chip fabrication process. Initially, this lack of an oxide layer in the die perimeter region of each die provides flexibility at the wafer level of fabrication. For instance, this lack of an oxide layer in the die perimeter region of each die may reduce the complexity of the layout since each die may be of an identical configuration. For example, since the die may be substantially equal in size, making a chip of a first size may include cutting a chip from the wafer that has dimensions of 2 die wide by 3 die long. Continuing with the example, if a larger chip is desired, one may simply cut a bigger section (e.g., a chip having dimensions of 3 die wide by 3 die long) from the wafer. In other words, variations of this first aspect may generally enable chips of a wide variety of sizes to be fabricated simply by severing the wafer at desired locations along appropriate die boundaries. Moreover, the resulting layout of the various die on the wafer does not in and of itself limit the configuration of any chips to be formed therefrom in terms of the number of die per chip.

The lack of an oxide layer in the die perimeter region also facilitates the separation of adjacent die from the wafer in a manner by providing a region which should be less susceptible to damage during the actual separation process (e.g., during sawing) or after an etch release. A number of features may be utilized by the first aspect to facilitate the realization of these types of advantages. In this regard, each adjacent pair of die in the case of the first aspect may be separated by what may be characterized as a die boundary. The oxide layer in each die associated with the first aspect may be spaced back at least about 25 microns, and more preferably from about 25 microns to about 100 microns from each of its die boundaries. In some variations, the oxide layer in each die may be spaced back from each of its corresponding die boundaries by a nominal distance comparable to at least half of the width of a saw kerf that may be utilized to separate the die. That is, the oxide layer in each die may be spaced inwardly of the perimeter of the given die by any one of the above-noted amounts. However, while some variations of the first aspect may exhibit the oxide layer being spaced back from one or more of its corresponding die boundaries by a distance greater than 100 microns, generally, the further the oxide layer is spaced back from the die boundary(ies), the smaller the size of the corresponding device region remaining on the die. In any event, each die perimeter region of the first aspect may be limited to the substrate, the dielectric layer, and a plurality of electrical traces that extend between adjacent pairs of die and that are disposed directly on the dielectric layer.

Surface micromachining may be used to fabricate at least a portion of the microelectromechanical assembly that is fabricated on each die in the case of the first aspect. Surface micromachining allows for the formation of a plurality of vertically spaced and structurally interconnected microstructures and for a complexity that is not readily producible by other fabrication techniques. One or more etchants are typically used to release each of these microelectromechanical assemblies at the end of the fabrication process so as to allow for at least some type of movement of one or more microstructures relative to the substrate. Since the sacrificial layers used in the most common type of surface micromachining systems is typically a silicon oxide, exposing any of the oxide that is disposed between the dielectric layer and the substrate may result in an undesired etching of the same. Therefore, the first aspect may include totally encasing the oxide layer between the dielectric layer and the substrate. As previously mentioned, this oxide layer may generally provide a function (among others) of supplying an additional electrical isolation layer (in addition to the dielectric layer) to the structure of the chip to further electrically isolate the substrate from the plurality of first microelectromechanical assemblies disposed on the device region of each die.

With further regard to using surface micromachining in relation to the first aspect, each first microelectromechanical assembly may include at least one and more typically a plurality of structural layers that are disposed in vertically spaced relation. "Vertically spaced" means that there is a gap between a given part of the first microelectromechanical system and an underlying structure, which may include the substrate. In one embodiment, no vertically spaced structure of any of the first microelectromechanical assemblies is disposed within about 100 microns of any adjacent die boundary. Consider the case where a first die is bordered by second, third, fourth, and fifth die. All vertically spaced portions of the first microelectromechanical assembly on the first die are disposed inwardly by the above-noted amount from the die boundary between the first and second die, from the die boundary between the first and third die, from the die boundary between the first and fourth die, and from the die boundary between the first and fifth die.

Each of the plurality of die on the chip of the first aspect may be of an identical structure or configuration. That is, the same microelectromechanical assembly may be fabricated on each die, and these microelectromechanical assemblies may collectively define a desired microelectromechanical system. For instance, such a microelectromechanical system may be a mirror array. In one embodiment, each microelectromechanical assembly includes a plurality of mirrors and at least one actuator interconnected therewith so as to be able to move the corresponding mirror in a desired manner relative to the substrate. These mirrors may be used for providing any appropriate optical function, including such that the chip is configured as an optical switch, an adaptive optical array, an optical scanner array, a thermal imaging array, or any other array of devices that may be too large to be wholly encompassed by one die.

The die perimeter region of each die associated with the chip of the first aspect may be configured such that there are no vertically-spaced layers or microstructures therewithin. That is, each die perimeter region may be configured such that all portions thereof are directly supported by an underlying layer or structure. This provides a desired configuration for handling of the chip such that handling tools would not contact sensitive device surfaces. One way to characterize each die perimeter region is as a die perimeter boundary channel or the like. Another way to characterize each such die perimeter region is that the dielectric layer disposed therein is vertically offset from those portions of the dielectric layer that are disposed in the device region of the corresponding die.

One or more electrical lines, conductors, traces or the like may progress from one die to an adjacent die, and thereby cross a die boundary therebetween in the case of the first aspect. The first aspect may include features that enhance this "electrical interconnection" of adjacent die. Consider the case where there is a first die and a second die. A first electrical trace may be disposed in the device region of the first die, while a second electrical trace may be disposed in the device region of the second die. A third electrical trace may be disposed in the die perimeter region of at least one of the first and second die. Both the first and second electrical traces terminate in spaced relation to the third electrical trace. A first electrical jump connection may extend between the first and third electrical traces, while a second electrical jump connection may extend between the second and third electrical traces. Therefore, an electrical signal may pass between the first die and the second die using the noted structure.

In one embodiment, the above-noted first jump connection that may be utilized by the first aspect includes a first post that extends at least generally upwardly from the first electrical trace, a second post that extends at least generally upwardly from the third electrical trace, and a first jumper that extends between the first and second posts. This configuration allows the first jumper to be disposed in vertically spaced relation to the entirety of the dielectric layer. Similarly, the above-noted second jump connection includes a third post that extends at least generally from the second electrical trace, a fourth post that extends at least generally upwardly from the third electrical trace, and a second jumper that extends between the third and fourth posts. This configuration also allows the second jumper to be disposed in vertically spaced relation to the entirety of the dielectric layer. In one embodiment, each corresponding pair of first and second jump connections are spaced back from the die boundary therebetween by a distance of at least about 25 microns, however, other distances may be appropriate.

In one embodiment, the above-noted first, second, and third electrical traces that may be utilized by the first aspect are disposed directly on the dielectric layer. Since the dielectric layer in the die perimeter region may be disposed at a lower elevation than those portions of the dielectric layer that are disposed in the corresponding device region, the first and second electrical traces may be characterized as being vertically offset from the third electrical trace. This same type of electrical interconnection may be utilized for each adjacent pair of die and for any number of electrical traces.

Shields may be disposed over electrical traces in the case of the first aspect. Each shield may be spaced back at least about 25 microns from an adjacentmost die boundary. Stated another way, each shield over each electrical trace that passes through a die perimeter region (directly or using the above-noted type of jump connections) is preferably spaced back from the die boundary by the above-noted amount. This provides a desired advantage when the chip of the first aspect is formed by sawing the same from a wafer. In any event, sawing through/along one or more of the types of die perimeter regions utilized by the first aspect, in an area where shields are not disposed over any electrical traces, desirably reduces the potential for the formation of debris/fragments that may adversely affect the operation of one or more of the microelectromechanical assemblies fabricated on the various die.

The chip of the first aspect may include a chip perimeter and a chip perimeter region that is disposed inwardly of the chip perimeter. The dielectric layer may be disposed directly on the substrate in this chip perimeter region, and the chip perimeter region may also be devoid of the oxide layer. The chip perimeter region may be defined by the die perimeter region of one or more die. In this case the chip perimeter could be defined by sawing along/through one or more die perimeter regions in the above-noted manner. A plurality of electrical traces may extend through the chip perimeter region and terminate at the chip perimeter. A shield may be disposed over at least a portion of each of these electrical traces. An end of each of the shields that is adjacentmost to the chip perimeter is preferably spaced back at least about 25 microns from the chip perimeter, however, other distances may be appropriate.

A second aspect of the present invention relates to a desirable way of establishing an electrical interconnection of sorts between adjacent die. Although this manner of establishing an electrical connection may be employed at the wafer stage, such electrical interconnections will then exist when the wafer is separated into chips as well. The second aspect will be described in the form of such a chip. A chip embodied by the second aspect includes a substrate and a plurality of die that are fabricated in an appropriate manner using this substrate. Each die includes a die perimeter region and a device region that is disposed inwardly of the corresponding die perimeter region. The device region of each die includes a first microelectromechanical assembly such that the chip may be properly characterized as having a plurality of first microelectromechanical assemblies. One or more electrical lines, conductors, traces or the like progress from between at least some adjacent pairs of die, and thereby cross a die boundary therebetween in the case of the second aspect.

The second aspect includes features that at least generally enhance this "electrical interconnection" of adjacent pairs of die. Consider the case where there is a first die and a second die that are disposed in abutting relation. A first electrical trace may be disposed in the device region of the first die, while a second electrical trace may be disposed in the device region of the second die. A third electrical trace may be disposed in the die perimeter region of at least one of the first and second die. Both the first and second electrical traces terminate in spaced relation to the third electrical trace. A first electrical jump connection extends between the first and third electrical traces, while a second electrical jump connection extends between the second and third electrical traces. Therefore, an electrical signal may progress between the first die and the second die using the noted structure.

Various refinements exist of the features noted in relation to the subject second aspect of the present invention. Further features may also be incorporated in the subject second aspect of the present invention as well. These refinements and additional features may exist individually or in any combination. Each of the plurality of die on the chip of the second aspect may be of an identical structure or configuration. That is, the same microelectromechanical assembly may be fabricated on each die, and these microelectromechanical assemblies may collectively define a desired microelectromechanical system. For instance, such a microelectromechanical system may be a mirror array. In one embodiment, each microelectromechanical assembly includes a plurality of mirrors and at least one actuator interconnected therewith so as to be able to move the corresponding mirror in a desired manner relative to the substrate. These mirrors may be used for providing any appropriate optical function, including, but not limited to, the chip being configured as an optical switch, an adaptive optical array, or an optical scanner array.

The first jump connection that may be utilized by the second aspect may include a first post that extends at least generally upwardly from the first electrical trace, a second post that extends at least generally upwardly from the third electrical trace, and a first jumper that extends between the first and second posts. Similarly, the second jump connection may include a third post that extends at least generally upwardly from the second electrical trace, a fourth post that extends at least generally upwardly from the third electrical trace, and a second jumper that extends between the third and fourth posts. In one embodiment, each corresponding pair of first and second jump connections is spaced back from the die boundary therebetween by a distance of at least about 25 microns. However, other distances may be appropriate.

The first and second electrical traces utilized by the second aspect may be disposed at one elevation, and the third electrical trace utilized by the second aspect may be disposed at a different elevation. That is, the first and second electrical traces may be vertically offset from the third electrical trace. One way in which these vertical offsets may be realized is by using surface micromachining techniques. The vertical offset of the noted electrical traces may exist by the die perimeter region of each die being configured such that there is no oxide layer between a dielectric layer and the substrate in these die perimeter regions. Therefore, the various features discussed above in relation to the first aspect may be utilized by the second aspect as well.

The jump connections associated with the second aspect reduce the potential for the development of shorts between adjacent electrical traces that cross die perimeter regions that are in the form of a channel or the like. Consider the case where the die perimeter region of each die includes a dielectric layer that directly interfaces with the substrate, while the device region of each die includes an oxide layer between this dielectric layer and the substrate to realize the benefits discussed above in relation to the first aspect. Therefore, the various features of the first aspect may be utilized by the second aspect as well. In the event that electrical traces were simply patterned directly on the dielectric layer to progress from one die to the next across a pair of abuttingly disposed die perimeter regions that collectively define a channel or the like along the perimeter of the device region, it is likely that electrical shorts would develop on one or both of the "vertical" walls of this channel. The second aspect addresses this potential condition by utilizing a plurality of discrete electrical traces that are disposed at least principally in the lateral dimension, along with a plurality of jump connections. Each such jump connection again may include typically a pair of at least generally vertically disposed electrical contacts or posts. The lower extremes of these electrical contacts or posts interface with the discrete electrical traces to be electrically interconnected, while the upper extremes of these electrical contacts or posts are electrically interconnected by a conductive strip or the like. Each jump connection electrically interconnects corresponding pairs of vertically offset electrical traces in a manner such that the above-noted vertical walls are bypassed by the electrical path. It should be appreciated that surface micromachining may be readily employed to fabricate a jump connection of this type.

A third aspect of the present invention relates to a method for fabricating a chip. The method includes forming a first oxide layer over an appropriate substrate. A first die boundary channel is formed in the first oxide layer. This first die boundary channel extends down through the first oxide layer and preferably to the substrate. A dielectric layer is formed over the first oxide layer and within at least a lower portion of the die boundary channel. A pair of die are defined on opposite sides of the first die boundary channel. Each of these die includes a microelectromechanical assembly. The first and second die are thereafter separated from each other along the first die boundary channel.

Various refinements exist of the features noted in relation to the subject third aspect of the present invention. Further features may also be incorporated in the subject third aspect of the present invention as well. These refinements and additional features may exist individually or in any combination. The first die boundary channel may be formed by patterning the oxide layer. A first die boundary channel may be formed around the perimeter of each die that is being fabricated on a wafer. This then does not provide a limiting factor in relation to the number of die utilized per chip.

The sidewalls of the first die boundary channel are defined by exposed edge surfaces of the oxide layer, while the floor or base of the first die boundary channel is preferably defined by the substrate. In one embodiment, the sidewalls of the first die boundary channel are disposed in at least substantially parallel relation. In another embodiment, the sidewalls of the first die boundary channel are separated by a distance that is generally within a range about 50 microns up to about 300 microns, however, other distances of separation may be appropriate. Forming the dielectric layer after defining the first die boundary channel allows a dielectric material to coat the exposed edge surfaces of the oxide layer that define the sidewalls of the first die boundary channel. As such, the oxide layer is in effect encased by a dielectric material. When the first and second die are separated along the first die boundary channel, such as by sawing, the cut does not result in the exposure of any of the oxide layer. This then protects the oxide layer when the resulting chip is exposed to a release etchant.

The formation of a dielectric layer over an oxide layer of the type presented by the third aspect will leave a depression in the dielectric layer that corresponds with the location of the first die boundary channel. This depression in the dielectric layer may be characterized as a second die boundary channel. There may be a need for an electrical signal to progress from one die to another die, and to thereby cross through the second die boundary channel, and to have a corresponding electrical trace formed on the dielectric layer. One way to provide this electrical path would be to utilize the configuration discussed above in relation to the second aspect. Those various features discussed above in relation to any of the aspects of the present invention may be incorporated in any other aspects of the present invention, and in any appropriate manner noted herein.

DETAILED DESCRIPTION

Figure 1A:
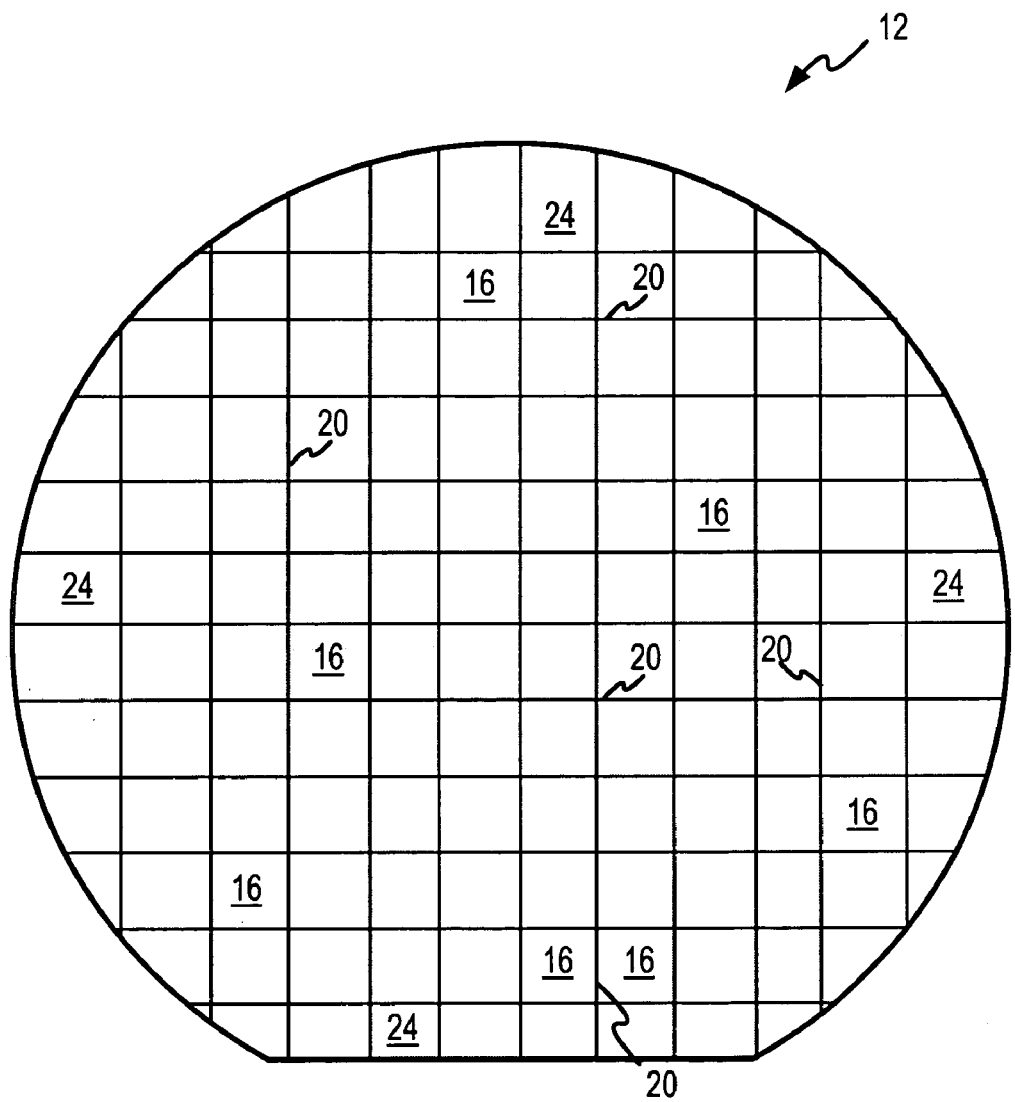
FIG. 1A is a plan view of one embodiment of a wafer having a plurality of die.

The present invention will now be described in relation to the accompanying drawings which at least assist in illustrating its various pertinent features. Surface micromachining may be utilized to fabricate the various microstructures to be described herein. Various surface micromachined microstructures and the basic principles of surface micromachining are disclosed in U.S. Pat. No. 5,867,302, issued Feb. 2, 1999, and entitled "BISTABLE MICROELECTRO-MECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED", the entire disclosures of which are incorporated by reference in their entirety herein.

Surface micromachining generally entails depositing alternate layers of structural material and sacrificial material using an appropriate substrate which functions as the foundation for the resulting microstructure, which may include one or more individual microstructures. The term "substrate" as used herein means those types of structures that can be handled by the types of equipment and processes that are used to fabricate micro-devices on, within, and/or from the substrate using one or more micro photolithographic patterns. An exemplary material for the substrate is silicon. Various patterning operations (collectively encompassing the steps of masking, etching, and mask removal operations) may be executed on one or more of these layers before the next layer is deposited so as to define the desired microstructure. After the microstructure has been defined in this general manner, at least some of the various sacrificial layers are removed by exposing the microstructure and the various sacrificial layers to one or more etchants. This is commonly called "releasing" the microstructure from the substrate, typically to allow at least some degree of relative movement between the microstructure and the substrate. The term "sacrificial layer", therefore, means any layer or portion thereof of any surface micromachined microstructure that is used to fabricate the microstructure, but which does not exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). Exemplary materials for the structural layers of the microstructure include doped or undoped polysilicon and doped or undoped silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

Only those portions of a microelectromechanical system that are relevant to the present invention will be described herein. There may, and typically will, be other microstructures that are included in a given microelectromechanical system.

FIG. 1A illustrates a wafer 12 having a plurality of die 16. Typically each die 16 will be of the same configuration. Each adjacent pair of die 16 is separated by a die boundary 20. Each die 16 is defined by one field of a photolithographic stepper. An exemplary stepper capable of defining the die 16 may be the Ultratech 1600DSA stepper manufactured by Ultratech Stepper, Inc., of San Jose, Calif. Any appropriate stepper may be utilized to define the die 16. It should be noted that the wafer 12 may also have a plurality of edge die 24 that define partial die patterns. The partial die 24 generally are not utilized in a product, but instead are usually discarded, or are not patterned at all.

Figure 1B:
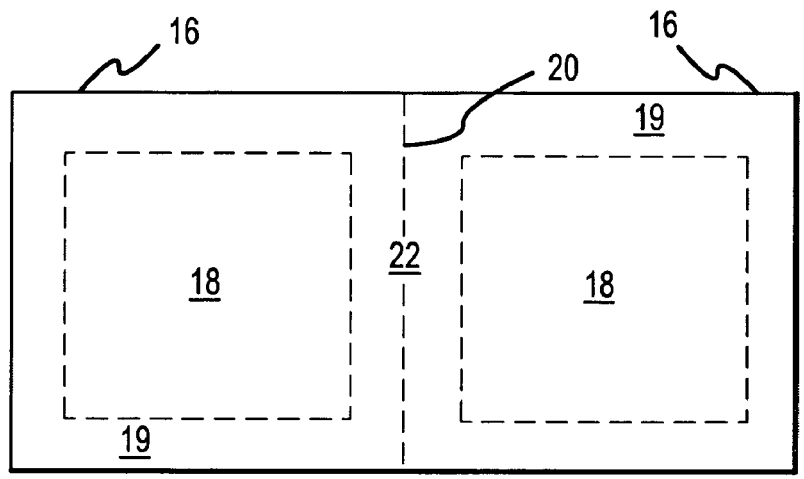
FIG. 1B is an enlarged plan view of a pair of die from the wafer of FIG. 1A.

FIG. 1B provides further details regarding the layout of the die 16 on the wafer 12. A microelectromechanical assembly is typically formed on only a certain portion of each die 16. In one embodiment, the same microelectromechanical assembly is formed on each die 16, and a chip having a plurality of these identical microelectromechanical assemblies may be defined by removing an appropriate collection of die 16 from the wafer 12 (e.g., by sawing). That area of a given die 16 that is occupied by a microelectromechanical assembly may be characterized as a device region 18. Each device region 18 of a given die 16 is surrounded by a perimeter region 19. An inter-die region 22 is disposed between each adjacent pair of die 16, and is thereby defined by a portion of the perimeter region 19 of each die 16. The inter-die region 22 between each adjacent pair of die 16 is also commonly referred to in the art as a street or avenue. Alignment targets (not shown) for the stepper may be formed on the wafer 12 in areas that will become the inter-die regions 22 to assist in aligning the various die 16 on the wafer 12. Adjacent die 16 on the wafer 12 are typically separated by sawing along the appropriate inter-die regions 22 surrounding a given die 16. As will be discussed in more detail below, one aspect of the present invention deals with a multi-die chip having a plurality of electrical traces extending between adjacent pairs of die 16. Therefore, at least certain areas of the inter-die regions 22 in this case will be occupied by these electrical traces.

Figure 1C:
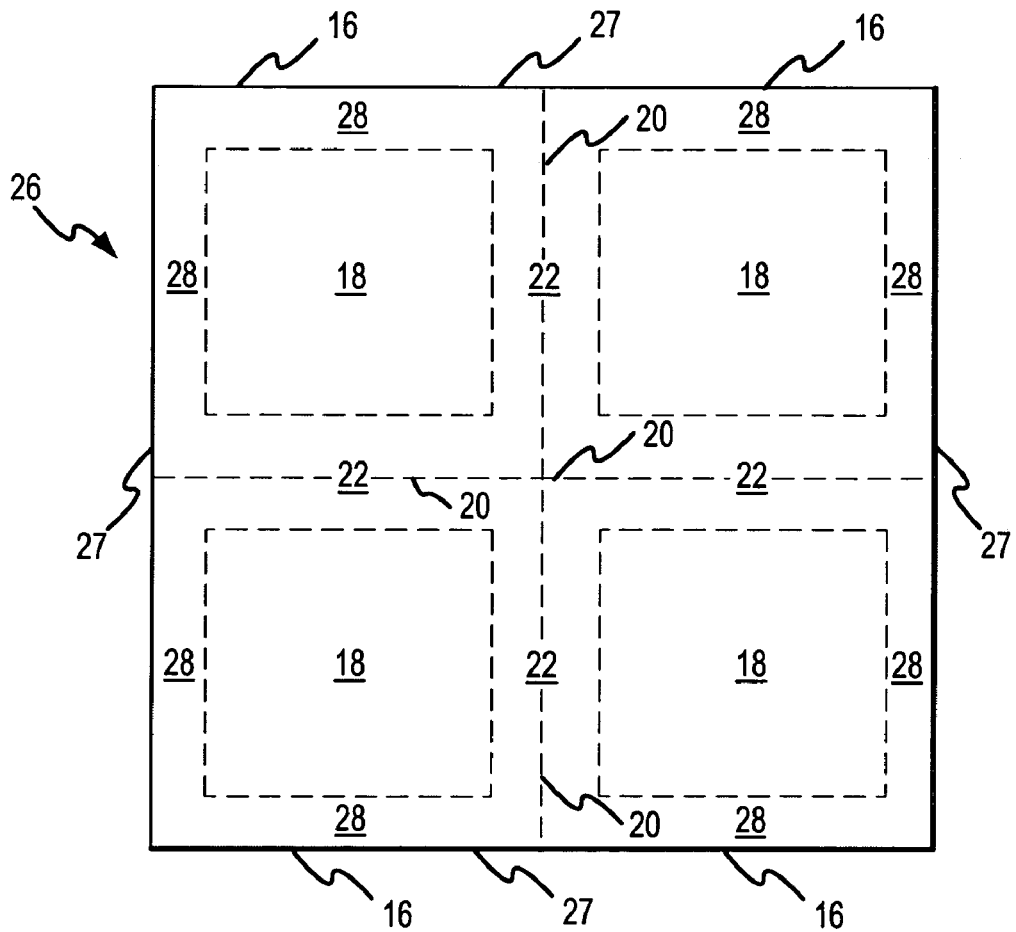
FIG. 1C is a plan view of one embodiment of a chip that may be separated from the wafer of FIG. 1A.

One embodiment of a chip 26 that may be formed from the wafer 12 is illustrated in FIG. 1C. The chip 26 includes four die 16 that were sawed from the wafer 12 at least generally along the relevant die boundaries 20. Any appropriate number of die 16 may be used to define the chip 26.

Once again, in one embodiment an identical microelectromechanical assembly is formed on each die 16. The chip 26 includes a chip perimeter 27 and a chip perimeter region 28 that is spaced inwardly from the chip perimeter 27. The chip perimeter region 27 is defined by that portion of a perimeter region 19 of a die 16 that does not abut a perimeter region 19 of another die 16.

Figure 1D:
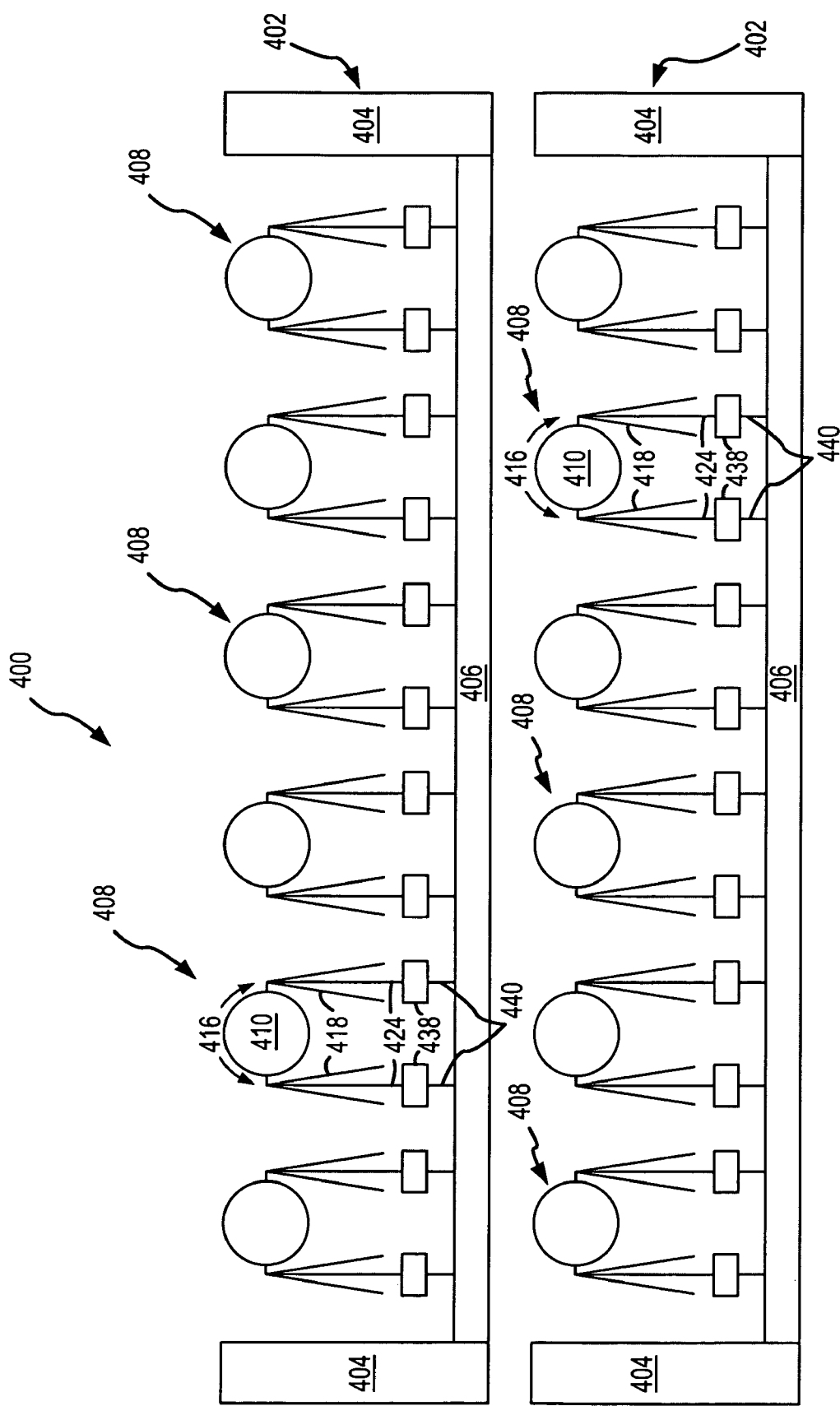
FIG. 1D is a plan view of one embodiment of at least a portion of a mirror array that may be formed on each die of the chip of FIG. 1C.

An appropriate microelectromechanical assembly is formed within the device region 18 of each die 16 of the chip 26. One embodiment of such a microelectromechanical assembly is illustrated in FIG. 1D in the form of a mirror array 400. The mirror array 400 is defined by a plurality of rows 402 of mirror assemblies 408. Power to each row 402 of mirror assemblies 408 is provided by an off-chip electrical contact assembly 404 that is disposed on each end of each row 402, and by a bus 406 that extends between each row 402. Representative functions that may be performed by the mirror array 400 include, but are not limited to optical switching, adaptive optical arrays, and optical scanner arrays. Any number of rows 402 may be defined on the device region 18 of a given die 16. Each row 402 of the mirror array 400 may be defined by any number of mirror assemblies 408. In one embodiment, six rows 402 of mirror assemblies 408 are utilized by the array 400, and there are 6 mirror assemblies 408 in each row 402. However, since there is a limited amount of space on each die 16, the number of mirror assemblies 408 per die 16 is limited. Therefore, providing a chip 26 having a plurality of identical die 16, each with a mirror array 400 fabricated thereon, allows for realizing an increased number of mirror assemblies 408.

Figure 1E:
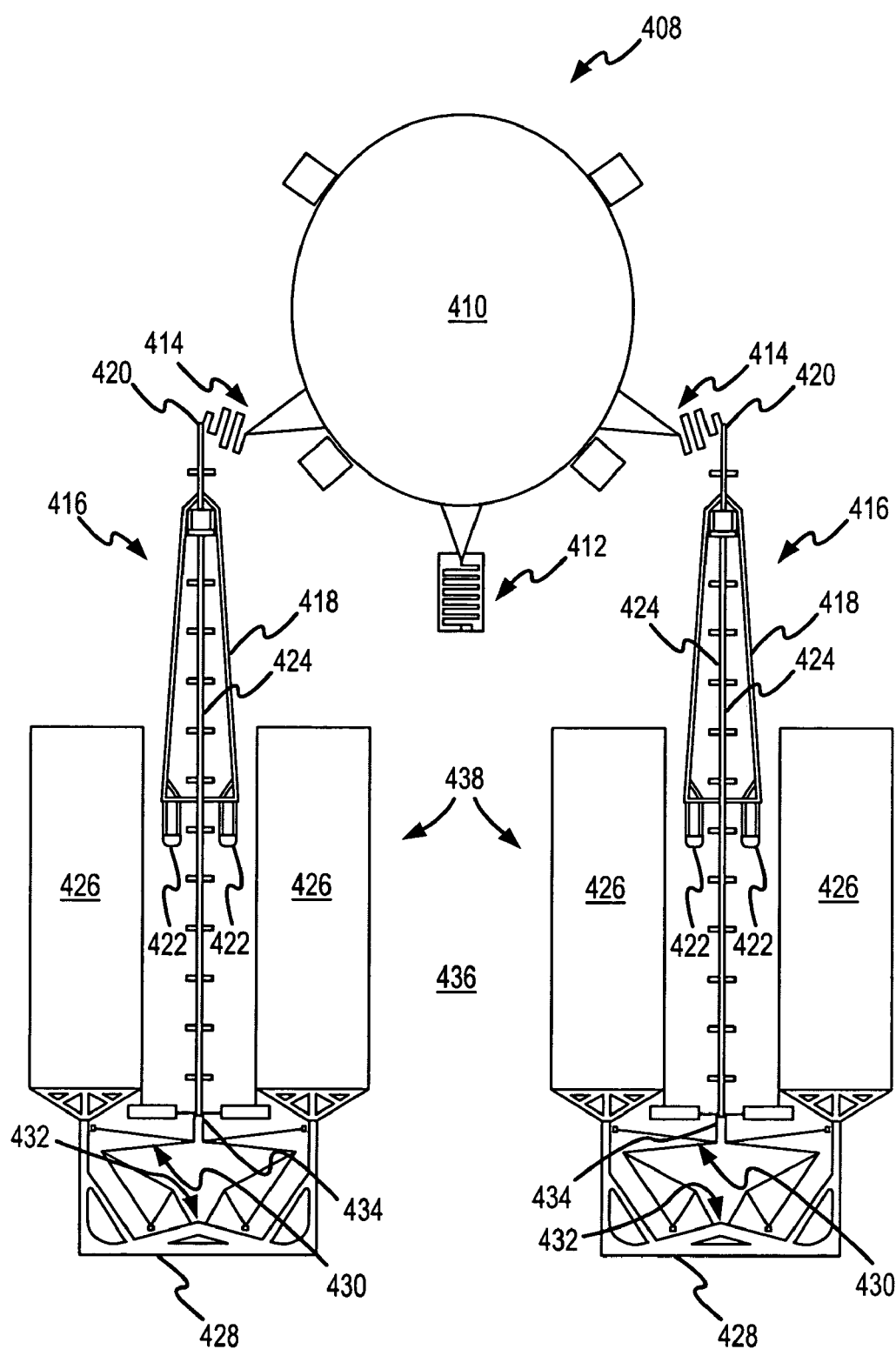
FIG. 1E is an enlarged plan view of one of the mirror assemblies from the mirror array of FIG. 1D.

Details regarding the configuration of each mirror assembly 408 of the mirror array 400 are presented in FIG. 1E. The mirror assembly 408 generally includes a mirror 410 and a pair of positioning assemblies 416 that are fabricated using an appropriate substrate 436. The mirror 410 is interconnected with the substrate 436 by a substrate interconnect 412 of any appropriate type (e.g., an appropriately configured compliant member/spring). The mirror 410 may be interconnected with the substrate 436 in any appropriate manner in order to realize a desired movement of the mirror 410 relative to the substrate 436 depending upon the position of each of the positioning assemblies 416. The mirror 410 in fact need not be interconnected with the substrate 436 at all.

Each positioning assembly 416 generally includes a displacement assembly 438. The displacement assembly 438 includes pair of actuators 426 that are collectively interconnected with a displacement multiplier 430. Power for each of the actuators 426 is provided by an actuator electrical interconnect assembly 440 from the bus 406 (FIG. 1D). Each positioning assembly 416 further includes a tether or coupling 424 an elevator 418. In this regard, the displacement multiplier 430 is interconnected with one end of the tether 424. The opposite end of the tether 424 in turn is interconnected with a portion of the elevator 418 that is able to move at least generally away from or toward the substrate 436, depending upon the direction of motion of the actuators 426 relative to the substrate 436. This movable portion of the elevator 418 in turn is interconnected with the mirror 410 by an elevator interconnect 414 of any appropriate type and at any appropriate location.

The actuators 426 may be of any appropriate type for microelectromechanical applications. Both actuators 426 are interconnected with the substrate 436 in any appropriate manner for movement at least generally in a lateral dimension (at least generally parallel to the lateral extent of the substrate 436). One or more electrical traces (not shown in FIG. 1E, but defining the actuator electrical interconnect assembly 440 illustrated in FIG. 1D) extend from the bus 406 of the mirror array 400 to each of the actuators 426. Movement of the actuators 426 relative to the substrate 436 is transferred to a common output yoke 428 or the like. Although a pair of actuators 426 are disclosed for each positioning assembly 416, the number of actuators 426 per positioning assembly 416 is not of particular importance in relation to the present invention.

The output yoke 428 is appropriately interconnected with an input structure 432 of the displacement multiplier 430. An output structure 434 of the displacement multiplier 430 is interconnected with the tether 424. The displacement multiplier 430 may be of any appropriate configuration to achieve a desired relative motion at least generally in the lateral dimension between the input structure 432 and the output structure 434. Generally, the input structure 432 and the output structure 434 each move relative to the substrate 436 by a flexing of those beams of the displacement multiplier 430 that are anchored to the substrate 436. Displacement multipliers are described in U.S. Pat. No. 6,174,179 to Kota et al. and issued on Jan. 16, 2001, the entire disclosure of which is incorporated by reference herein.

Movement of the output structure 434 of the displacement multiplier 430 is transferred to the elevator 418 by the tether 424. The elevator 418 may be of any appropriate configuration. Generally, the elevator 418 includes a free end 420 that is able to move at least generally away from or toward the substrate 436 along an appropriate path, depending upon the direction of the motion of the actuators 426. This motion may be characterized as being at least generally of a pivotal-like nature in that the free end 420 of the elevator 418 moves at least generally about an axis that extends through a pair of anchors 422 where the elevator 418 is fixed to the substrate 436. Flexures or the like may be used to interconnect the elevator 418 with the anchors 422. This motion is then transferred to the mirror 410 by the corresponding elevator interconnect 414. It should be appreciated that the mirror 410 may be disposed in a variety of positions relative to the substrate 436 depending upon the position of the free end 420 of each of the elevators 418, where the elevators 418 interconnect with the mirror 410, and where, if at all, the mirror 410 is interconnected with the substrate 436.

Figure 2:
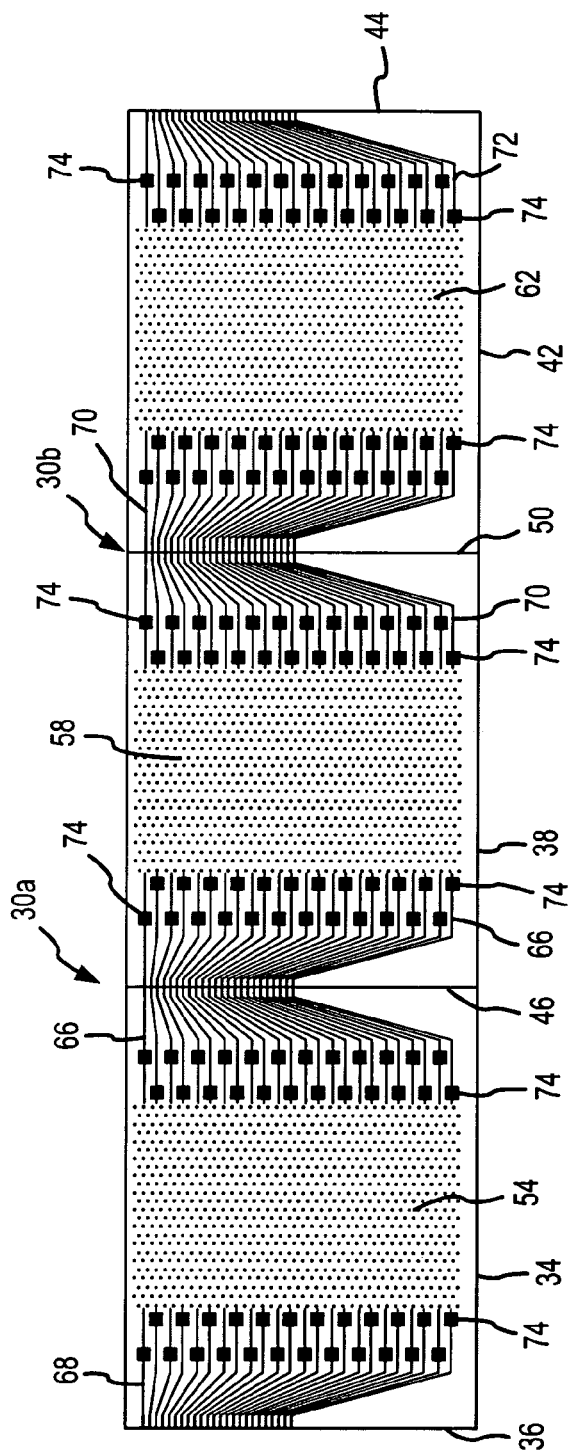
FIG. 2 is a top view of three die configurations that may be utilized by the wafer of FIG. 1A.

FIG. 2 illustrates a series of adjacent die of the type that may be formed on the wafer 12 of FIG. 1A. A first die 34, a second die 38, and a third die 42 are generally formed on an appropriate substrate (such as the wafer 12 of FIG. 1A). The first die 34 and second die 38 are separated by a first die boundary 46. Similarly, the second die 38 and third die 42 are separated by a second die boundary 50. The first die 34 generally has a microelectromechanical assembly (not shown, but for instance, the mirror array 400 of FIG. 1D) disposed in a first device region 54. Likewise, the second die 38 generally has a microelectromechanical assembly (not shown, but for instance, the mirror array 400 of FIG. 1D) disposed at a second device region 58, and the third die 42 generally has a microelectromechanical assembly (not shown, but for instance, the mirror array 400 of FIG. 1D) disposed at a third device region 62. An inter-die region 30a is disposed between the first device region 54 and the second device region 58, while an inter-die region 30b is disposed between the second device region 58 and the third device region 62. A plurality of first conductive lines or traces 66 extend across the first die boundary 46 and electrically interconnect the first and second device regions 54, 58 of the respective first and second die 34, 38. Similarly, a plurality of second conductive lines or traces 70 extend across the second die boundary 50 and interconnect the second and third device regions 58, 62 of the respective second and third die 38, 42. The first die 34 also has a plurality of third conductive lines or traces 68 that extend from the first device region 54 to a die boundary 36 of the first die 34. This die boundary 36 may abut a similarly configured die (not shown) or may define the edge of a chip that includes the die 34, 38, 42. Likewise, the third die 42 has a plurality of fourth conductive lines or traces 72 that extend from the third device region 62 to a die boundary 44 of the third die 42. This die boundary 44 similarly may abut a similarly configured die (not shown) or may define the edge of a chip that includes the die 34, 38, 42. "Conductive lines or traces," as referred to herein, generally are fabricated from an appropriate structural material(s) that is capable of providing an electrical path. An off-chip electrical contact 74 (e.g., a bond pad or the like) is disposed in each of the various conductive lines between the corresponding device region and the corresponding die boundary.

Figure 3A:
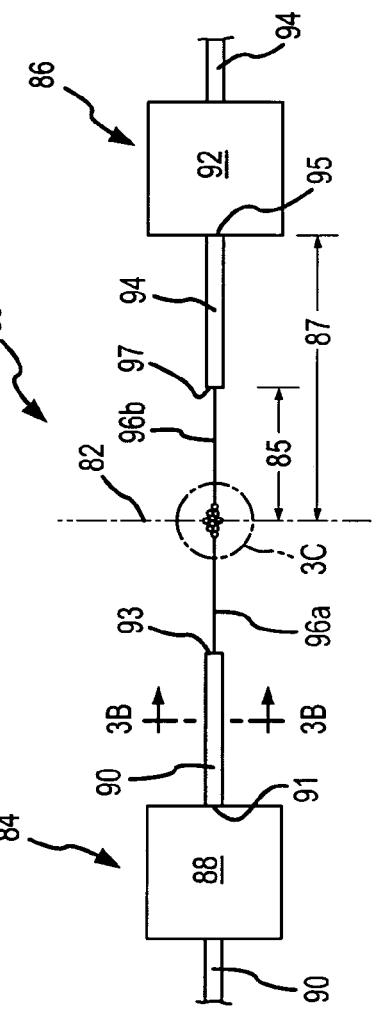
FIG. 3A is a magnified top view of an inter-die region between first and second die.

FIG. 3A illustrates a magnified view of an inter-die region 80 between first and second die 84, 86, respectively. In one embodiment, a wafer may be fabricated to have each of its die exhibit the same characteristics to be discussed in relation to the die 84, 86. Moreover, any chip may include any number of die having the type of characteristics to be discussed in relation to the die 84, 86. The first die 84 and second die 86 are separated by a die boundary 82. The first die 84 includes a first electrical contact pad 88 and a first line shield 90. Similarly, the second die 86 has a second electrical contact pad 92 and a second line shield 94. A conductive line or trace 96a extends from the die boundary 82 to the first contact pad 88. Similarly, a conductive line or trace 96b extends from the die boundary 82 to the second contact pad 92. The conductive lines 96a, 96b also extend from the contact pads 88, 92, respectively, to a device region (not shown) associated with the corresponding die 84, 86.

The first line shield 90 houses only a portion of the conductive line 96a. This first line shield 90 includes a first distal end 93 disposed toward but spaced back from the die boundary 82. Similarly, the second line shield 94 houses only a portion of the conductive line 96b. This second line shield 94 includes a second distal end 97 disposed toward but spaced back from the die boundary 82. The first and second distal ends 93, 97 of the respective first and second line shields 90, 94 are each separated from the die boundary 82 by a first distance 85 of at least about 25 microns in one embodiment, and within a range of about 25 microns to about 100 microns in another embodiment. The first and second contact pads 88, 92 are also spaced back from the die boundary 82 by a second distance 82 of at least about 50 microns in one embodiment, and within a range of about 50 microns to about 200 microns in another embodiment. Spacing each of the shields 90, 94 back from the die boundary 82 alleviates the need to saw through the shields 90, 94 if the first die 84 is to be separated from the second die 86. Furthermore, spacing each of the shields 90, 94 back from the die boundary 82 also reduces the potential that the shields 90, 94 will become damaged during handling of the resultant chip(s). That is, the shields 90, 94 are sufficiently spaced from the die boundary 82 so that the potential for contacting the same during handling of the resultant chip(s) should be desirably reduced.

Figure 3B:
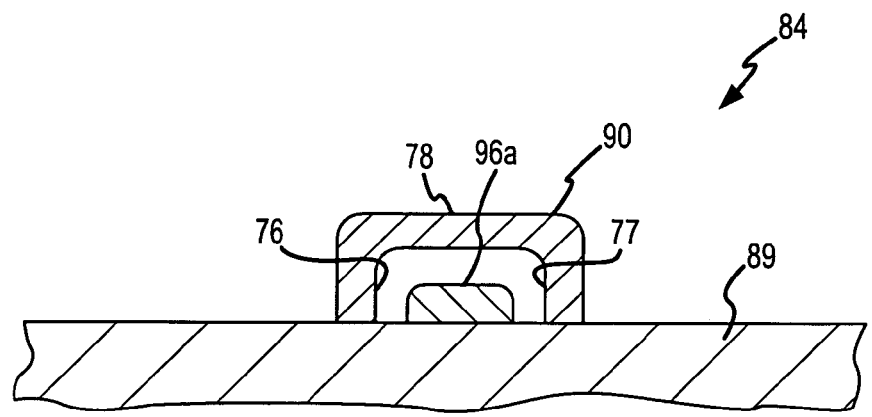
FIG. 3B is a cross-sectional view of the first die of FIG. 3A taken along cut-line 3B—3B.

FIG. 3B illustrates further details regarding the relationship between the shield 90 and the conductive line 96a, and the same is equally applicable to the shield 94 and conductive line 96b. The conductive line 96a and the first line shield 90 are in direct contact with a dielectric layer 89 of the first die 84. The first line shield 90 includes first and second laterally spaced shield walls 76, 77. The first line shield 90 has a shield top 78 that is disposed in spaced relation to the conductive line 96 by the first and second shield walls 76, 77. With this configuration, it should be appreciated that it would be desirable to avoid having to saw through the shields 90, 94 if separating the die 84 from the die 86.

Figure 3C:
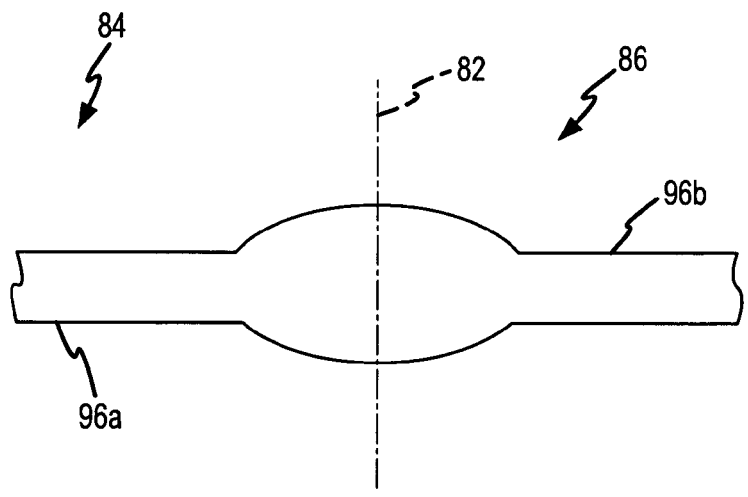
FIG. 3C is a magnified top view of circle 3C of FIG. 3A.
Figure 3D:
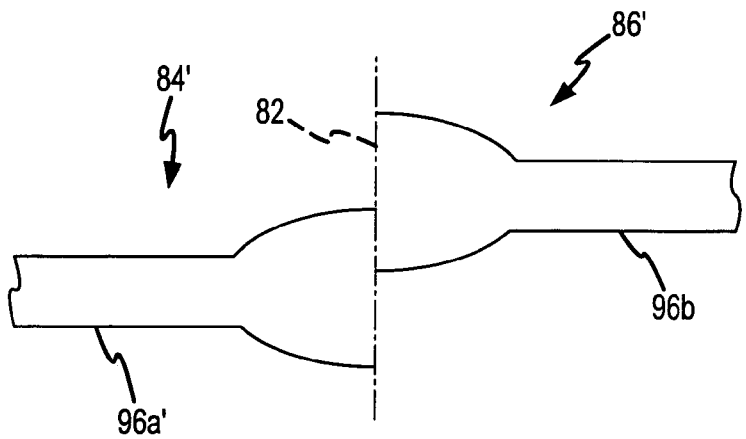
FIG. 3D is alternative embodiment of the configuration illustrated in FIG. 3C.

FIGS. 3A and 3C illustrated that the end portions of the conductive lines 96a, 96b are bulged at the die boundary 82. This is done to ensure adequate "overlap" of the conductive line 96a of the first die 84 and the conductive line 96b of the second die 86. That is, the end portions of the lines 96a, 96b are bulged at the die boundary 82 to increase the potential for establishing electrical contact between the lines 96a, 96b when fabricating the die 84, 86 on a wafer. FIG. 3D illustrates a situation where at least one of the die 84', 86' was misaligned on the wafer. Since the resulting configuration of FIG. 3D is different from that of FIGS. 3A and 3C, a "single prime" designation is used in FIG. 3D. Even though this misalignment exists in the case of the FIG. 3D embodiment, the bulged end portions of the conductive lines 96a, 96b still sufficiently overlap at the die boundary 82 to establish an electric connection across the die boundary 82. The size of the bulge is dependant and determined by the die-to-die alignment tolerancing of the specific photolithographic stepper tool being used.

Figure 4A:
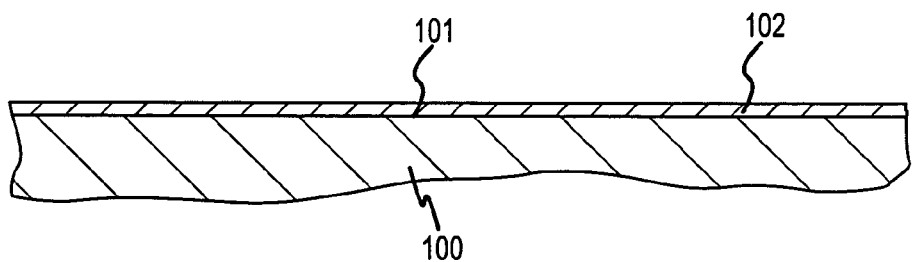
FIGS. 4A–4K are sequential views of a method for making a chip having at least one conductive line and corresponding line shield(s).
Figure 4B:
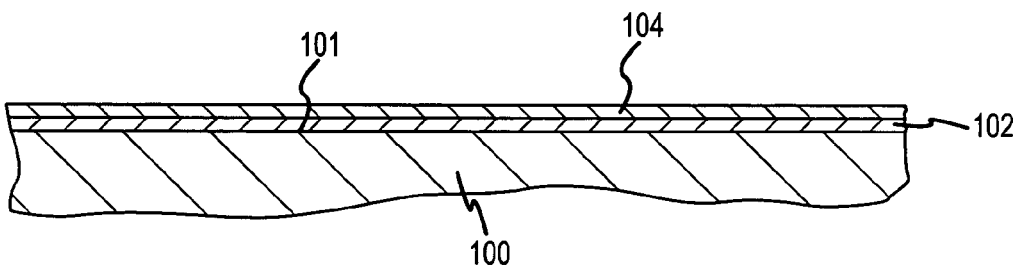

FIGS. 4A–4K illustrate a method for forming a conductive line or trace and corresponding line shield of the type discussed above in relation to FIGS. 3A–D. In FIG. 4A, an oxide layer 102 is formed over a first substrate 100 so that a lateral dimension of a top surface of the oxide layer 102 is at least generally parallel with a first upper surface 101 of the first substrate 100. FIG. 4B shows a non-conductive dielectric layer 104 formed over the oxide layer 102. While FIG. 4B illustrates that the oxide layer 102 remains across the entirety of the upper surface 101 of the first substrate 100, other embodiments to be described herein have this oxide layer 102 patterned so that only part of the oxide layer 102 remains prior to forming the dielectric layer 104. In this case, the dielectric layer 104 is in direct contact with the upper surface 101 of the first substrate 100.

Figure 4C:
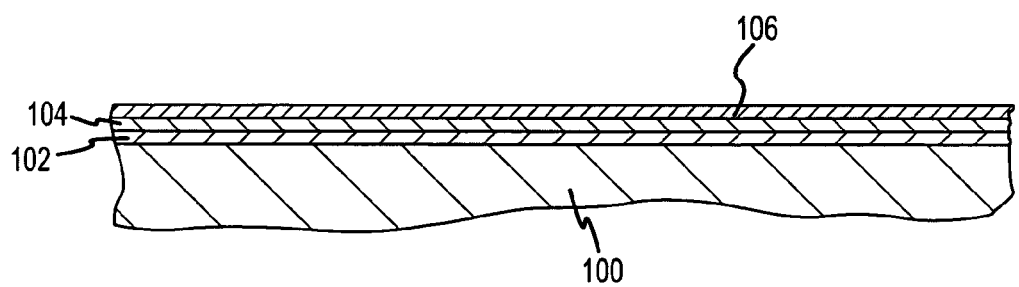
Figure 4D:
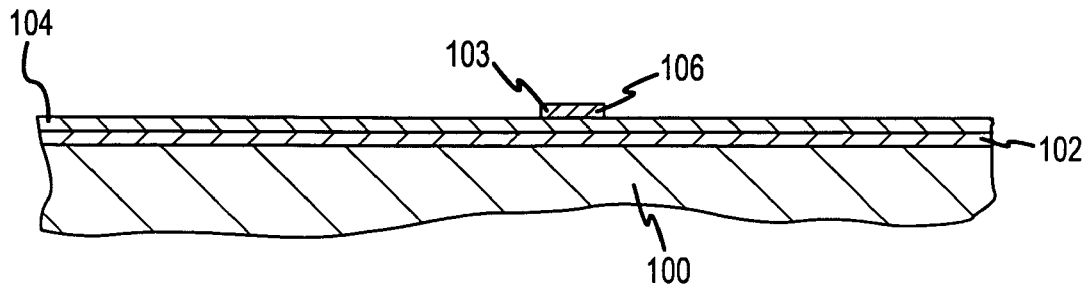
Figure 4E:
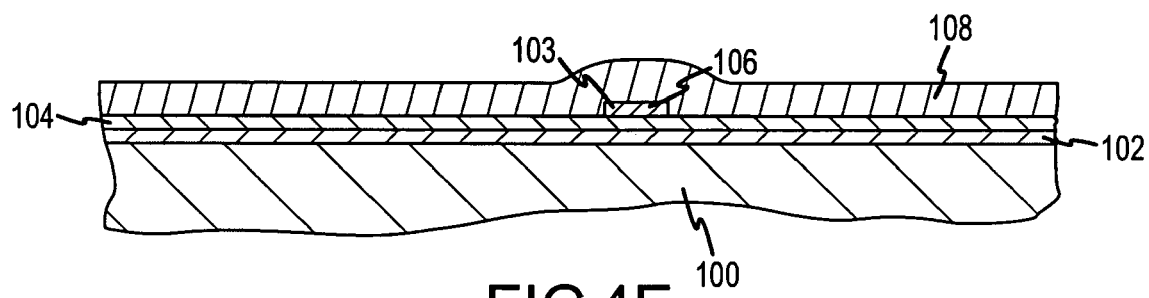
Figure 4F:
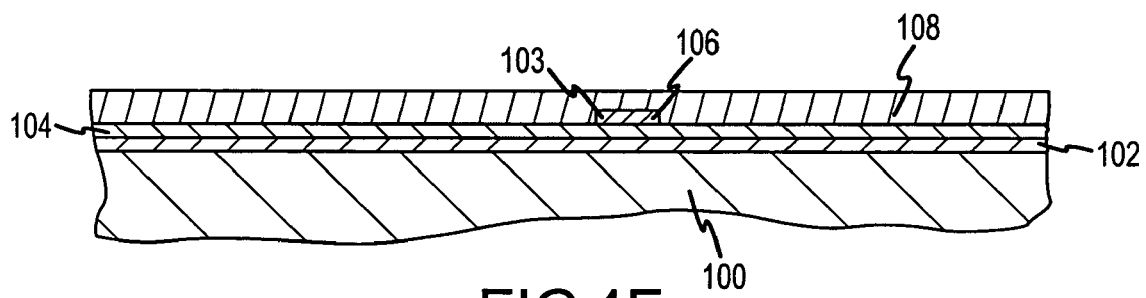
Figure 4G:
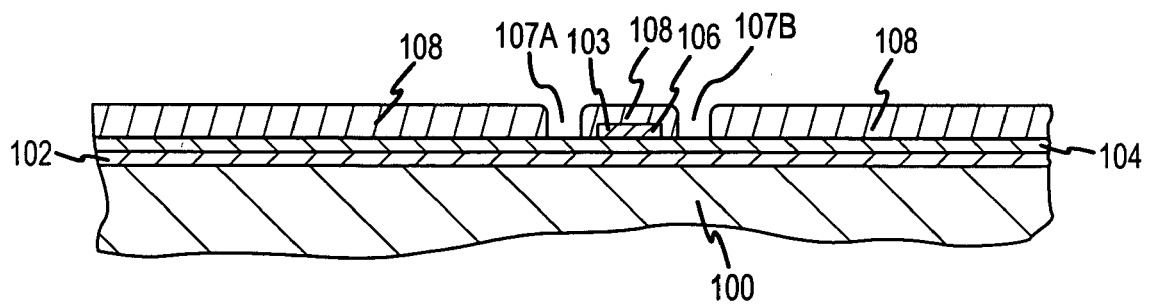

A first structural layer 106 is formed over the dielectric layer 104 in FIG. 4C, and in FIG. 4D the first structural layer 106 is patterned to form a first conductive line or trace 103. In FIG. 4E, a first sacrificial layer 108 is formed over the first conductive line 103. The portion of the first sacrificial layer 108 that is formed over the first conductive line 103 will likely be bulged to a certain degree. It may then be desirable to planarize the first sacrificial layer 108 into the form presented in FIG. 4F. FIG. 4G illustrates that first and second shield channels 107A, 107B can then be patterned into the first sacrificial layer 108 in spaced relation to and on opposite sides of the first conductive line 103. This patterning step of FIG. 4G generally includes etching entirely through the first sacrificial layer 108 and down to the dielectric layer 104. Accordingly, these first and second shield channels 107A, 107B are generally at least partially defined by the first sacrificial layer 108.

Figure 4H:
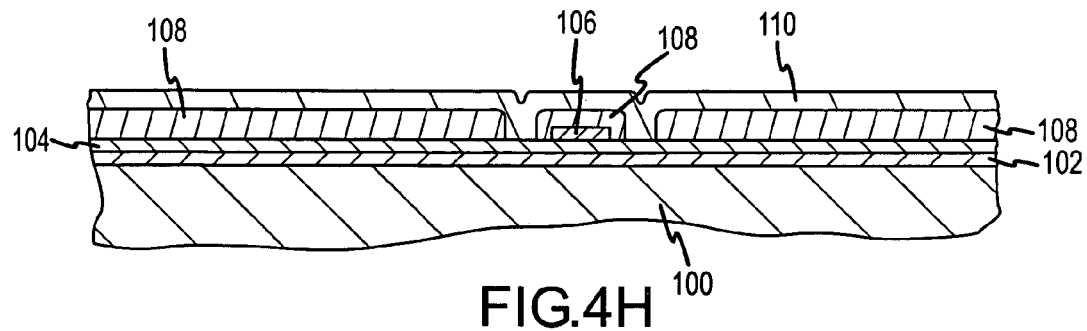
Figure 4I:
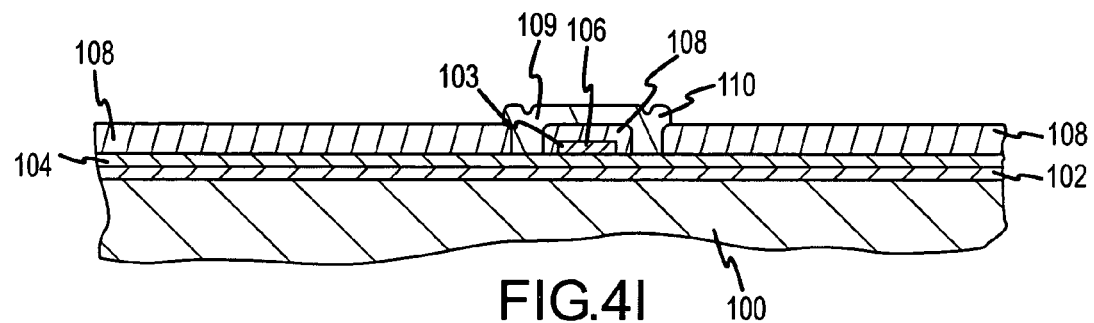
Figure 4J:
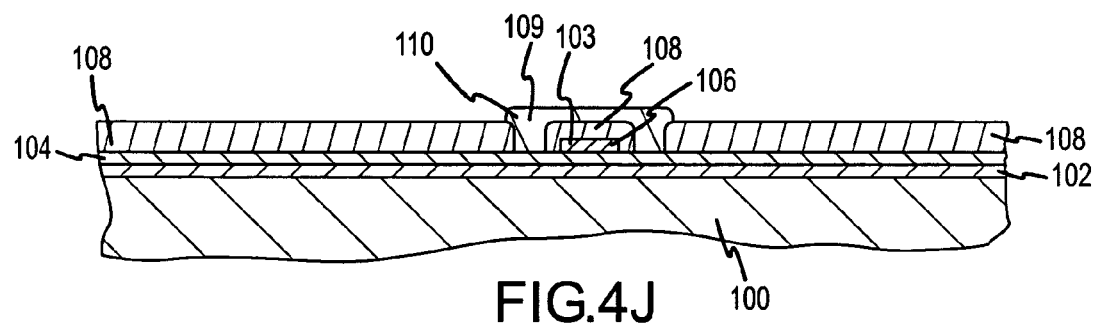
Figure 4K:
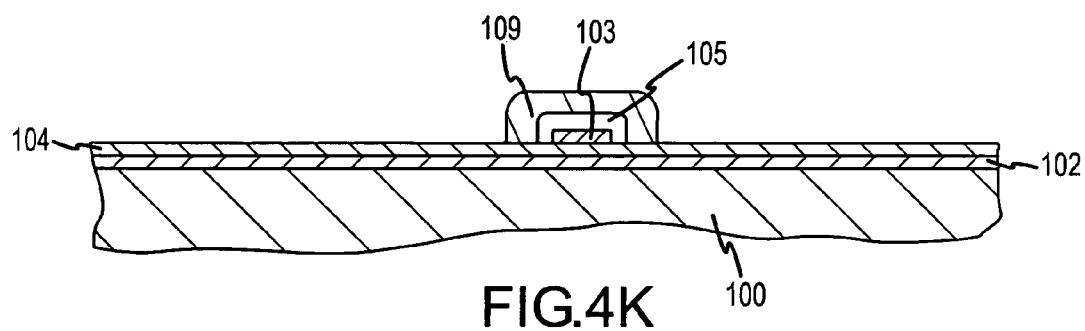

As shown in FIG. 4H, a second structural layer 110 is then generally formed over the first sacrificial layer 108. The material that defines the second structural layer 110 will also then occupy the space within the channels 107A, 107B that were formed in the first sacrificial layer 107A, 107B. The second structural layer 110 may be patterned to define the upper portion of a line shield 109 as illustrated in FIG. 4I. Since there will be depressions in the second structural layer 110 over the channels 107A, 107B, it may be desirable to planarize the upper surface of the second structural layer 110 before patterning the same. The resulting configuration from such a planarization is presented in FIG. 4J. Finally, and as shown in FIG. 4K (from the planarized configuration of FIG. 4J), the first sacrificial layer 108 is removed by contacting the same with an appropriate release etchant. The result of the method illustrated in FIGS. 4A–4K is a conductive line 103 that is substantially isolated from electrical "cross-talk" with any adjacent conductive lines by a line shield 109. Both the conductive line 103 and the shield 109 are in direct contact with the non-conductive dielectric layer 104. In addition, the conductive line 103 is appropriately separated from the line shield 109 by an open space 105.

Figure 5A:
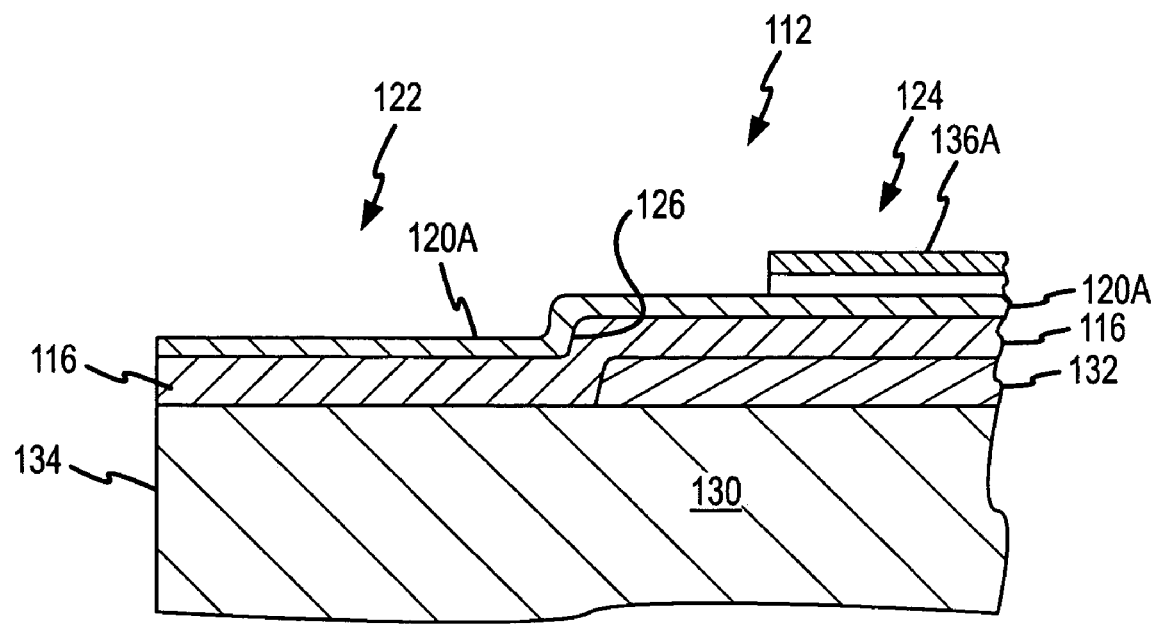
FIG. 5A is a cross-sectional view of the die of FIG. 5B taken along cut-line 5A—5A.
Figure 5B:
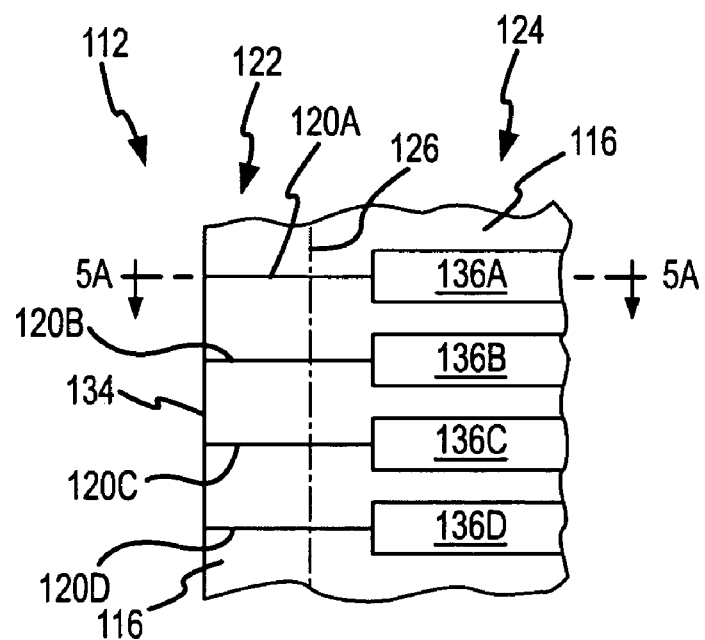
FIG. 5B is a top view of the die of FIG. 5A.

Another embodiment of a die 112 is presented in FIGS. 5A–B. The die 112 includes a die boundary 134. This die boundary 134 may define an edge of a chip (where each die of the chip may be configured in the manner of the die 112) or may join with a similarly configured die to define an inter-die region generally of the above-noted type (not shown). Any such adjoining die would of course be a mirror image of the configuration presented in FIG. 5A. The die 112 of FIGS. 5A–B generally includes a die perimeter region 122 that is disposed inwardly of the die boundary 134, and a device region 124 that is disposed inwardly of the die perimeter region 122. Any appropriate microelectromechanical assembly may be fabricated in the device region 124, including the mirror array 400 discussed above in relation to FIGS. 1D–E.

The die 112 is configured in a manner so as to enhance the separation of the die 112 from the wafer and to facilitate handling of the die 112 once removed from a wafer. In this regard, the die 112 is formed on an appropriate substrate 130. An oxide layer 132 is disposed on the substrate 130 in the device region 124, but not in the die perimeter region 122. One way in which this may be fabricated is by depositing the oxide layer 132 over the entire surface of the substrate 130, and thereafter patterning the oxide layer 132 so as to remove the oxide layer 132 from what is to be the die perimeter region 122. In one embodiment, the oxide layer 132 is spaced from the die boundary 134 by a distance of at least about 25 microns, and in another embodiment by a distance within a range of about 25 microns to about 100 microns.

A dielectric layer 116 is formed over the oxide layer 132 in the device region 124 and directly on the substrate 130 in the die perimeter region 122. As such, that portion of the dielectric layer 116 in the die perimeter region 122 is vertically offset from that portion of the dielectric layer 116 in the device region 124. Because of the intermediate oxide layer 132 in the device region 124, the dielectric layer 116 is disposed further from the substrate 130 in the device region 124 in relation to the die perimeter region 122 (which dielectric layer 116 interfaces with the substrate 130). An at least generally vertically disposed wall 126 of dielectric material interconnects these vertically offset portions of the dielectric layer 116.

A plurality of conductive lines 120A–D are formed on the dielectric layer 116 including within the device region 124, within the die perimeter region 122, and along the wall 126. These conductive lines 120A–D each extend to the die boundary 134 and also extend within the device region 124. Shields 136A–D at least generally of the type discussed above in relation to the embodiment of FIGS. 3A–C are disposed over their corresponding conductive line 120A–D. Preferably, each such shield 136A–D is spaced inwardly from the die boundary 134 in the same manner discussed above in relation to the embodiment of FIGS. 3A–C.

The configuration of the die 112 provides a number of advantages. Initially, the die 112 realizes the above-noted advantages regarding having the shields 136 being sufficiently spaced from the die boundary 134. Moreover, the configuration of the die 112 provides for an encasement of the oxide layer 132. Consider the case were the die 112 is formed on a wafer and is separated from the remainder of the wafer by sawing at least generally along its corresponding die boundary 134 or at least within the die perimeter region 122. Since the outer perimeter of the oxide layer 132 is spaced inwardly from the die boundary 134, this sawing will not pass through the oxide layer 132 and thereby will not expose the oxide layer 132. As such, when the die 112 is exposed to an etchant to release the microelectromechanical assembly fabricated in its device region 124, the release etchant will not have access to the oxide layer 132 and thereby will not remove any portion of the oxide layer 132. This would not be the case if the oxide layer 132 was retained both in the device region 124 and in the die perimeter region 122, where the sawing would pass through the oxide layer 132. Subsequent exposure of the die 112 to a release etchant would likely remove at least a perimeter portion of the oxide layer 132 and leave an overlying portion of the dielectric layer 116 unsupported. This would not be desirable on a number of bases.

Notwithstanding the benefits of the configuration of the die 112, there is one potential drawback. There may be an issue of shorts developing between adjacent conductive lines 120 on the at least generally vertically disposed wall 126 of the dielectric layer 116. When an appropriate layer is formed on the dielectric layer 116 and patterned to define the conductive lines or traces 120A–D, it may not be possible to remove all of the material between what are supposed to be the discrete lines 120A–D on the wall 126 due to the etchant tendencies. The failure to define separate and discrete conductive lines 120A–D on the wall 126 may lead at least some of the conductive lines 120A–D to short, which of course would not be desirable.

Figure 6A:
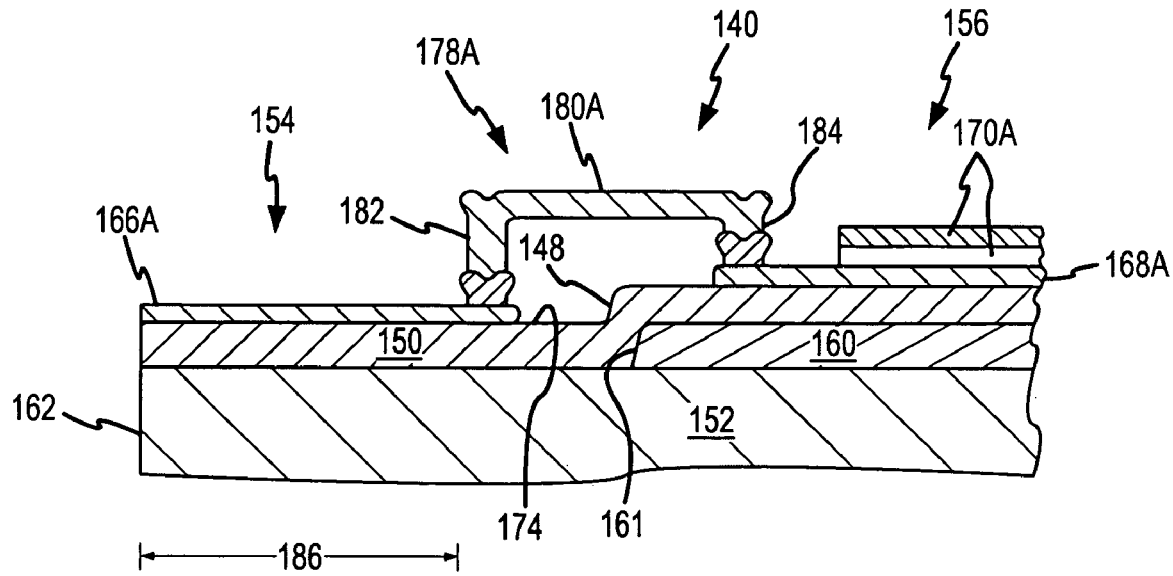
FIG. 6A is a cross-sectional view of the die of FIG. 6B taken along cut-line 6A—6A.
Figure 6B:
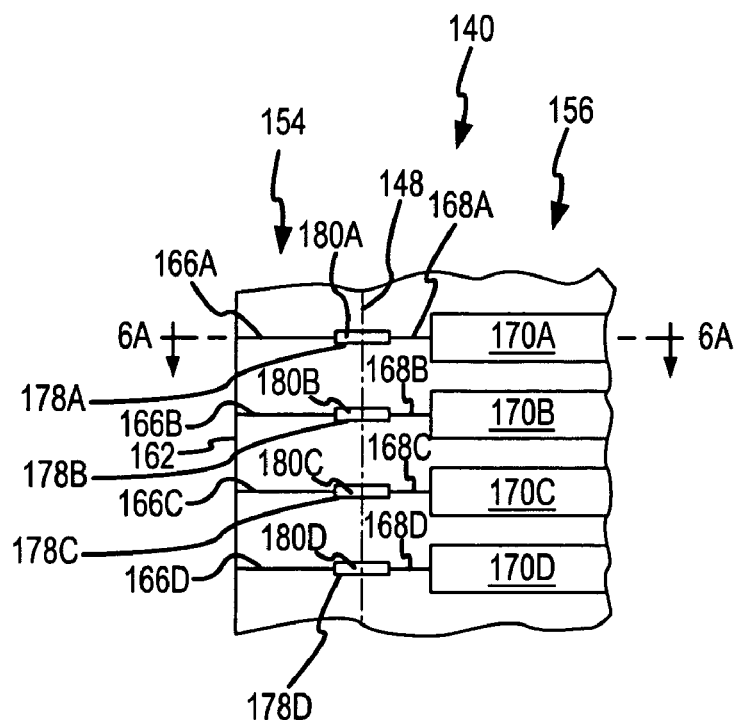
FIG. 6B is a top view of the die of FIG. 6A illustrating a bridge structure electrically interconnecting first and second segments of respective conductive lines.

Another embodiment of a die 140 is illustrated in FIGS. 6A–B. Generally, the die 140 realizes the same benefits as the die 112 of FIGS. 5A–B. In addition, the die 140 desirably addresses the above-noted potential shorting problem of the die 112 of FIGS. 5A–B. The die 140 of FIGS. 6A–B includes a die boundary 162. This die boundary 162 may define an edge of a chip or may join with a similarly configured die to define an inter-die region generally of the above-noted type (not shown). Any such adjoining die would of course be a mirror image of the configuration presented in FIGS. 6A–B. The die 140 generally includes a die perimeter region 154 that is disposed inwardly of the die boundary 162, and a device region 156 that is disposed inwardly of the die perimeter region 154. Any appropriate microelectromechanical assembly may be fabricated in the device region 156, including the mirror array 400 discussed above in relation to FIGS. 1D–E.

The die 140 is formed on a substrate 152. An oxide layer 160 is disposed on the substrate 152 in the device region 156, but not in the die perimeter region 154. That is, a perimeter 161 of the oxide layer 160 is laterally spaced from the die boundary 162. One way in which this may be fabricated is by depositing the oxide layer 160 over the entire surface of the substrate 152, and thereafter patterning the oxide layer 160 so as to remove the oxide layer 160 from what is to be the die perimeter region 154. In any case, a dielectric layer 150 is formed over the oxide layer 160 in the device region 156 and on the substrate 152 in the die perimeter region 154. As such, that portion of the dielectric layer 150 in the die perimeter region 154 is vertically offset from that portion of the dielectric layer 150 in the device region 156. An at least generally vertically disposed wall 148 of dielectric material interconnects these vertically spaced portions of the dielectric layer 150.

The die 140 further includes a plurality of conductive lines or traces 166A–D and corresponding conductive lines or traces 168A–D that are arranged/electrically interconnected in a manner which alleviates the shorting issue discussed above in relation to the die 112. In this regard, the conductive lines 166A–D progress from the die boundary 162 toward, but not to, the wall 148 of the dielectric layer 150 such that they terminate in spaced relation thereto. The conductive lines 168A–D are disposed in the device region 156 and thereby in overlying relation to the oxide layer 160. These conductive lines 168A–D progress toward, but not to, the wall 148 from an opposite side/direction in relation to the conductive lines 166A–D. Since the conductive lines 168A–D are separated from the substrate 152 by only the dielectric layer 150, while the conductive lines 168A–D are separated from the substrate 152 by both the dielectric layer 150 and the oxide layer 160, the conductive lines 166A–D are vertically offset from their corresponding conductive line 168A–D. Shields 170A–D generally of the type discussed above in relation to the embodiment of FIGS. 3A–C are disposed over their corresponding conductive lines 168A–D. Preferably, each such shield 170A–D is spaced inwardly from the die boundary 162 in the same manner discussed above in relation to the embodiment of FIGS. 3A–C.

The conductive lines 166A–D are electrically interconnected with their corresponding conductive lines 168A–D by a corresponding jump connector or bridge 178A–D. Details regarding the configuration of these bridges 178A–D are illustrated in FIG. 6A. The bridge 178A includes first and second electrically conductive posts 182, 184 that contact and extend at least generally upwardly from the respective conductive lines 166A and 168A. Each of these posts 182, 184 may be formed from one or more structural layers in a surface micromachined system (two of such layers in the illustrated embodiment). Since the post 182 interfaces with the conductive line 166A, it is taller than the post 184 that interfaces with the conductive line 168A and that is disposed at a higher elevation. Both the first and second posts 182 and 184 are also laterally spaced from the wall 148 of the dielectric layer 150. In order to reduce the potential for damage to the bridge 178A during handling, the post 182 is spaced back from the die boundary 162 by a distance of at least about 25 microns in one embodiment, and within a range of about 25 microns to about 100 microns in another embodiment.

An electrically conductive jumper 180A extends between and electrically interconnects the posts 182, 184 of the bridge 178A. The jumper 180A is disposed in vertically spaced relation to the uppermost portion of the wall 148 of the dielectric layer 150. Therefore, a current flowing through the conductive line 168A from the device region 156 flows up the post 184 through the jumper 180A, down the post 182, and through the conductive line 168A. As a result of this bypass, the possible existence of any material that is used to form the conductive lines 166A and 168A and that is not removed from the wall 148 of the dielectric layer 150 when patterning the conductive lines 166A, 168A will be electrically isolated from the conductive lines 166A, 168A.

Figure 7A:
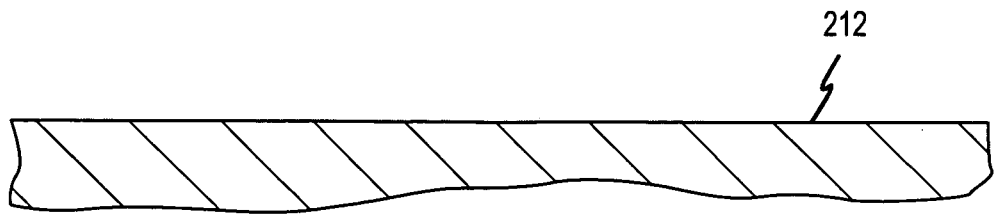
FIGS. 7A–Q are sequential views of a method for making a die of the type presented in FIGS. 6A–B.
Figure 7B:
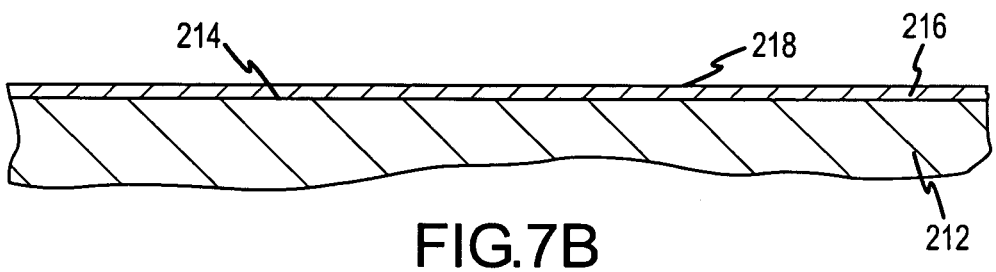
Figure 7C:
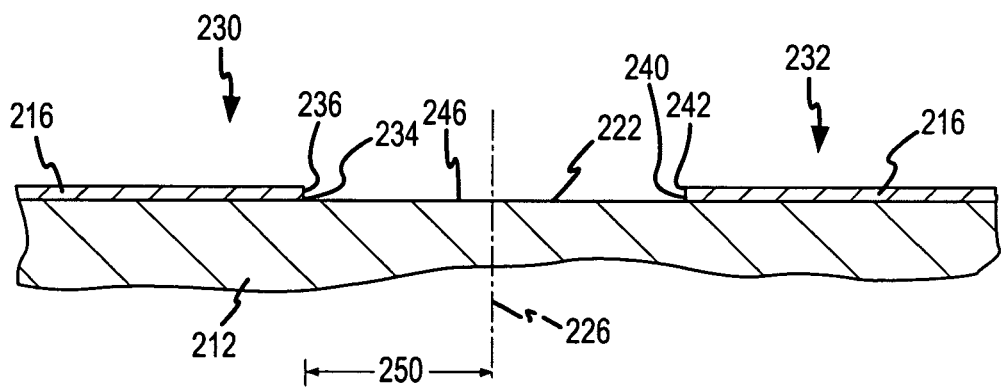
Figure 7D:
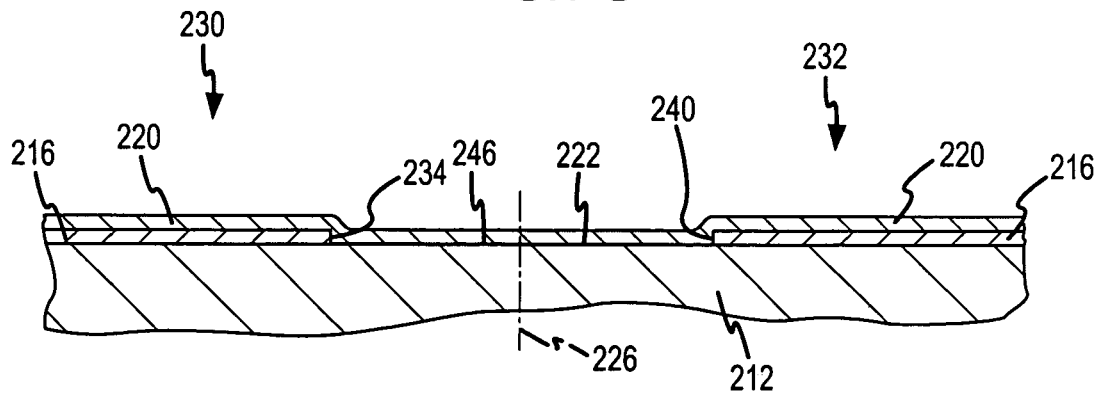
Figure 7E:
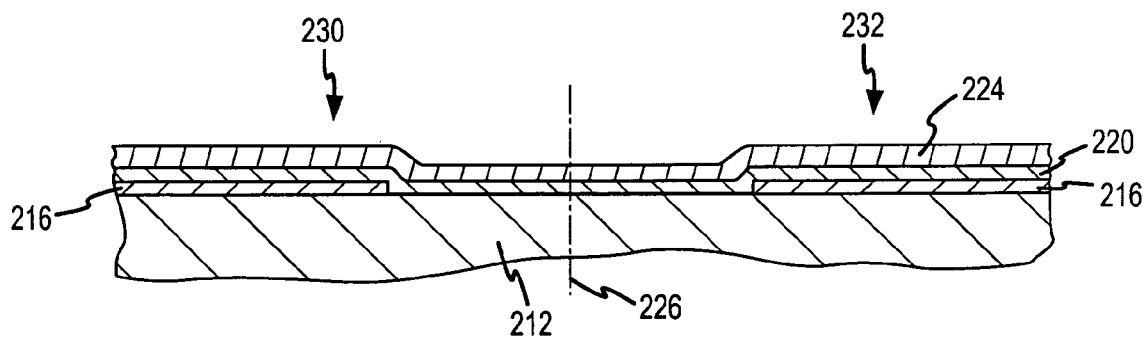
Figure 7F:
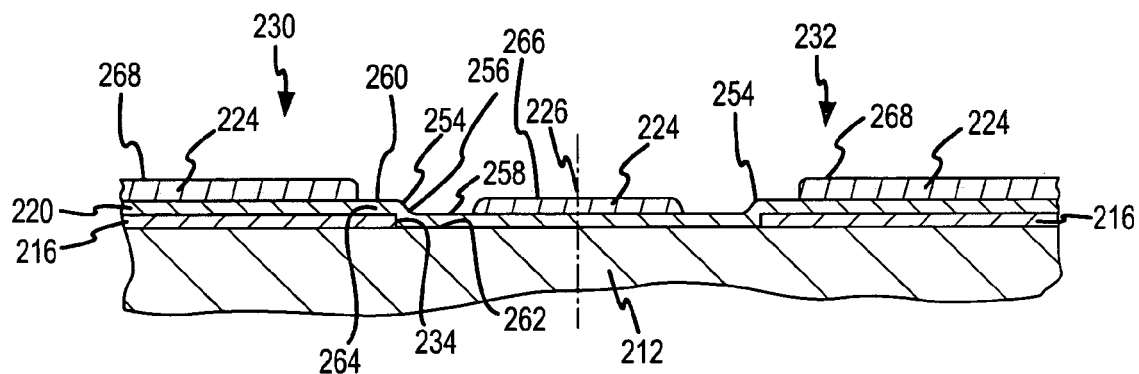
Figure 7G:
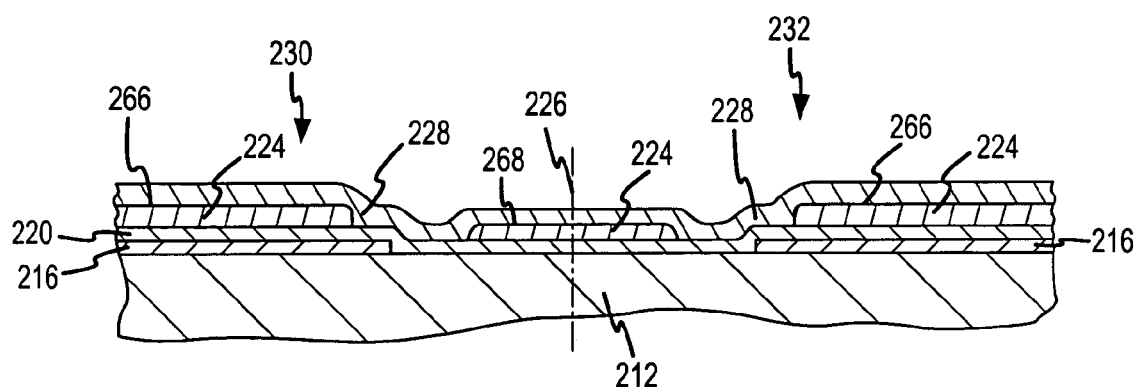
Figure 7H:
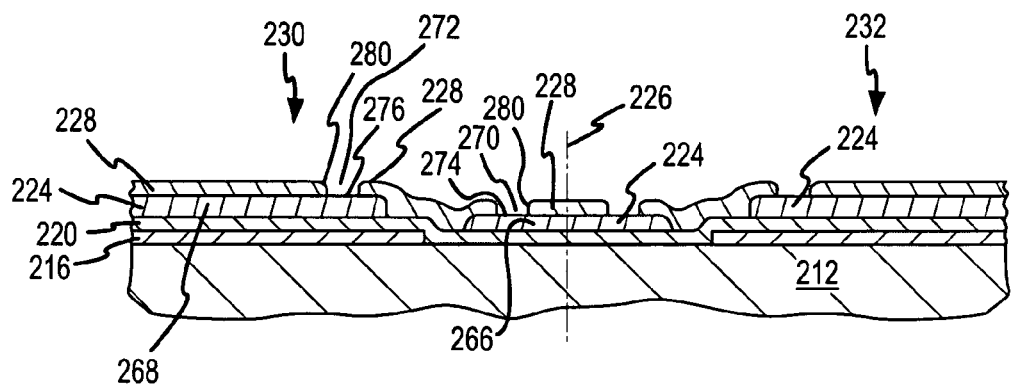
Figure 7I:
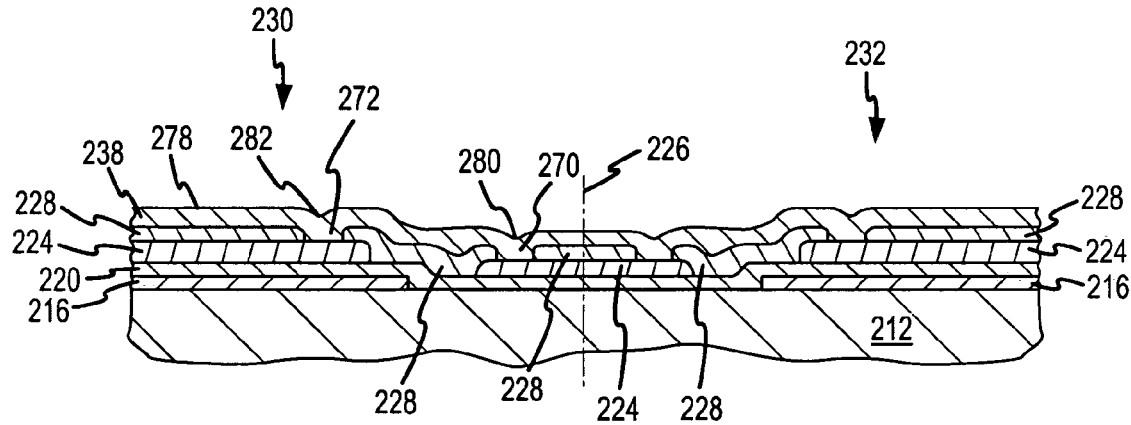
Figure 7J:
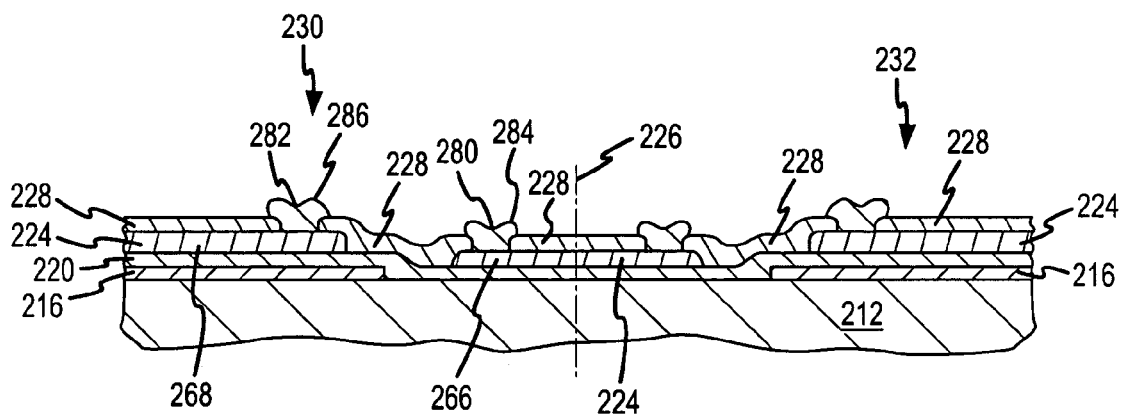
Figure 7K:
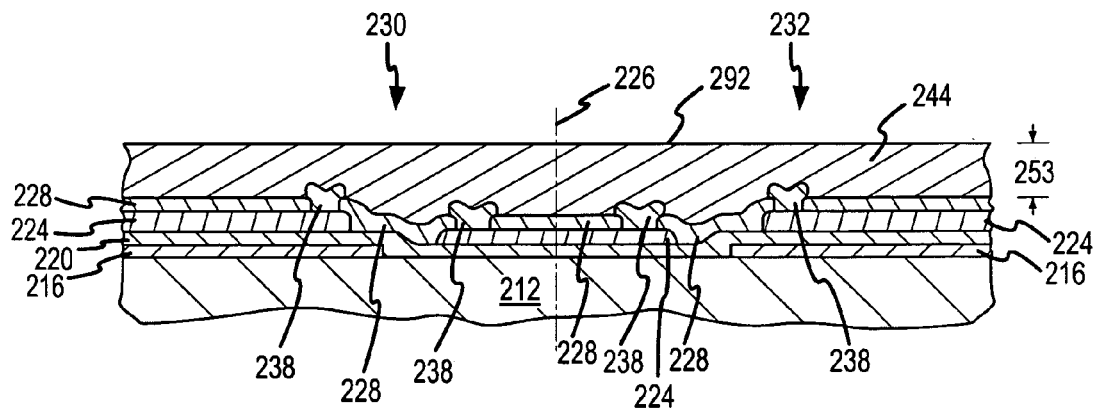
Figure 7L:
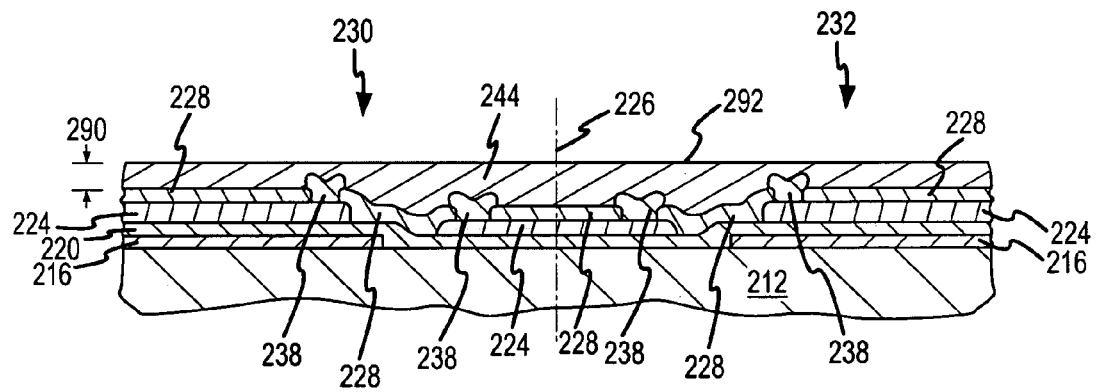
Figure 7M:
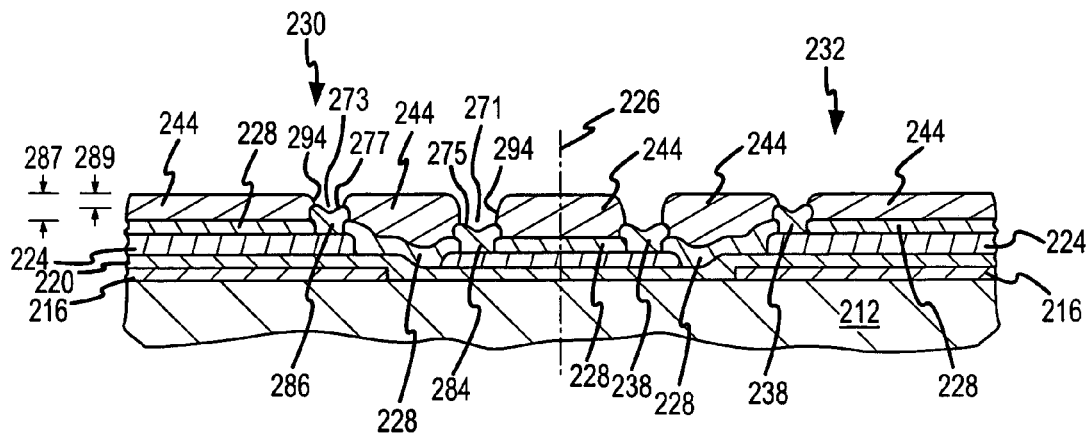
Figure 7N:
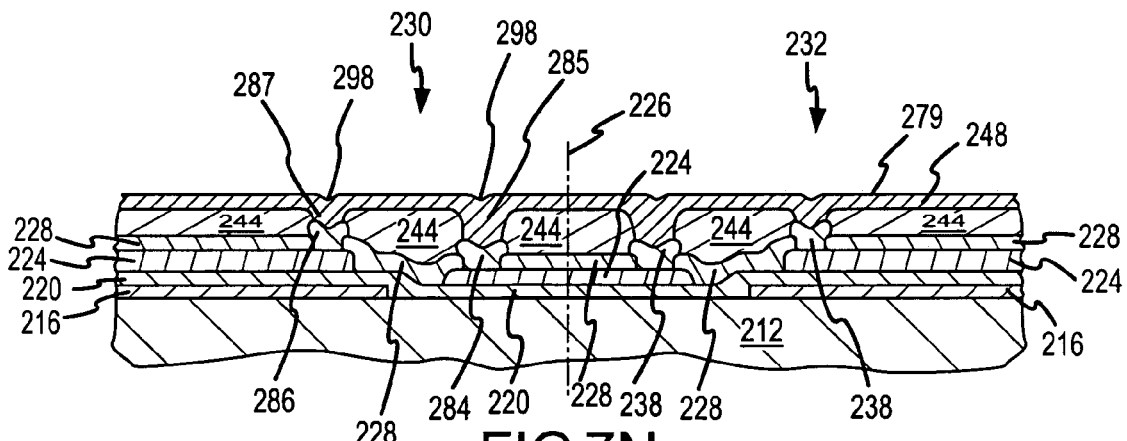
Figure 7O:
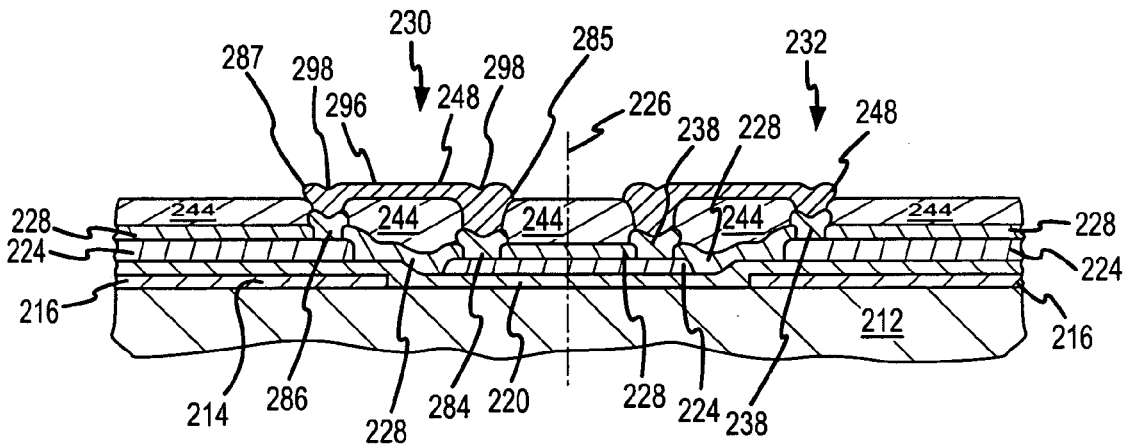
Figure 7P:
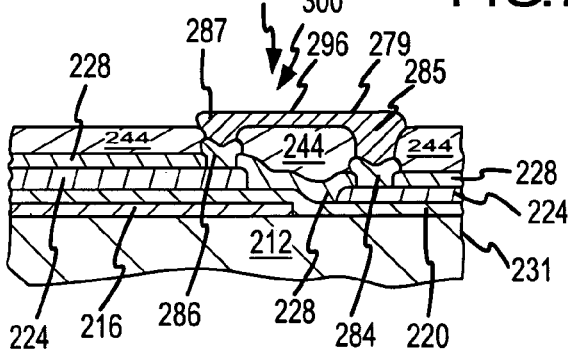
Figure 7Q:
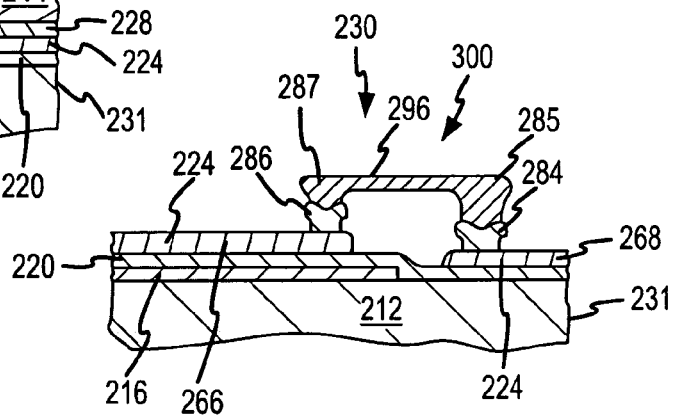

FIGS. 7A–7Q illustrate a method for forming multiple, electrically interconnected die of the type presented in FIGS. 6A–B. Referring to FIG. 7A, a first substrate 212 is utilized as a base material. Multiple layers are sequentially deposited/formed over this first substrate 212. As illustrated in FIG. 7B, a first oxide layer 216 is formed over the first substrate 212 so that a lateral dimension of a top surface 218 of the first oxide layer 216 is at least generally parallel with a first upper surface 214 of the first substrate 212. FIG. 7C then shows that a laterally extending die boundary channel 222 is patterned to encompass a die boundary 226 that separates first and second die 230, 232. A first wall 234 of the die boundary channel 222 is generally defined by a first portion 236 of the first oxide layer 216 disposed on the first die 230. Similarly, a second wall 240 of the die boundary channel 222 is defined by a second portion 242 of the first oxide layer 216 disposed on the second die 232. A floor 246 of the die boundary channel 222 is defined by the first substrate 212. The first and second walls 234, 240 of the die boundary channel 222 are at least generally vertically disposed. In one embodiment, the first and second walls 234, 240 of the die boundary channel 222 are each separated from the die boundary 226 by a first distance 250 of at least about 50 microns.

Referring to FIG. 7D, a dielectric layer 220 is formed over the first oxide layer 216 and the die boundary channel 222. Thus, the first and second walls 234, 240 and the floor 246 of the boundary channel 222 are covered with the dielectric layer 220. Accordingly, a direct interface is provided between the dielectric layer 220 and the first substrate 212 at the floor 246 of the boundary channel 222. That is, the dielectric layer 220 and the portion of the first substrate 212 that defines the floor 246 of the boundary channel 222 are in a surface-to-surface contact relationship.

With regard to the remaining portion of the method for making the chip 140 of FIGS. 6A–B, the description will be directed only to the first die 230. However, homologous structural components will be shown (but not described) for the second die 232. It will be understood that any of the structural and/or functional descriptions pertaining to the first die 230 may also pertain to the second die 232.

As shown in FIG. 7E, a first structural layer 224 is formed over the first dielectric layer 220. Referring to FIG. 7F, this first structural layer 224 is generally patterned to at least form conductive lines 266, 268 that are separate and discrete from each other. The conductive line 266 is positioned over the floor 246 of the boundary channel 222 and the conductive line 268 is positioned over the first oxide layer 216 such that the lines 266, 268 are vertically offset. Additionally, this patterning step exposes a knee area 254 defined by a first portion 256 of the dielectric layer 220 which generally covers the first wall 234 of the die boundary channel 222, a second portion 258 of the dielectric layer 220 which covers a first segment 262 of the floor 246 of the die boundary channel 222 juxtaposed to the first wall 234, and a third portion 260 of the dielectric layer 220 which covers a second segment 264 of the top surface 218 of the first oxide layer 216 juxtaposed to the first wall 234.

Referring to FIG. 7G, a first sacrificial layer 228 is formed over the first structural layer 224 including the conductive lines 266, 268. This first sacrificial layer 228 is then patterned to form first and second post receptacles 270, 272, as illustrated in FIG. 7H. A first bottom surface 274 of the first post receptacle 270 is defined by a portion of the conductive line 266. Similarly, a second bottom surface 276 of the second post receptacle 272 is defined by a portion of the conductive line 268. In addition, walls 280 of these first and second post receptacles 270, 272 are at least partially defined by the first sacrificial layer 228. As illustrated, the patterning of these first and second post receptacles 270, 272 includes etching through the entirety of the first sacrificial layer 228.

Thus, at a minimum, these first and second post receptacles 270, 272 allow for establishing a structural connection with the respective conductive lines 266, 268 of the first structural layer 224.

Referring now to FIG. 7I, a second structural layer 238 is formed over the first sacrificial layer 228. More specifically, the structural material that makes up the second structural layer 238 is also deposited within and at least substantially fills the first and second post receptacles 270, 272. In other words, this structural material substantially occupies an entirety of the first and second post receptacles 270, 272. In addition, first and second depressions 280, 282 are formed on a superior surface 278 of the second structural layer 238 generally in vertical alignment with where the structural material occupies the respective first and second post receptacles 270, 272. Referring to FIG. 7J, this second structural layer 238 is then patterned to have respective first and second posts 284, 286 having lower portions that are generally complimentary in shape, design, and configuration with the first and second post receptacles 270, 272. As shown, the resultant first and second posts 284, 286 are in direct contact with the respective conductive lines 266, 268 of the first structural layer 224.

Referring now to FIG. 7K, a second sacrificial layer 244 is formed over the second structural layer 238. More specifically, the second sacrificial layer 244 is formed over the first and second posts 284, 286 of the second structural layer 238 as well as the first sacrificial layer 228. Although FIG. 7K shows a definitive border between the first and second sacrificial layers 228, 244, typically this will not be the case as the second sacrificial layer 244 and the first sacrificial layer 228 will generally appear to be continuous. In any case, an upper surface 292 of the second sacrificial layer 244 may retain a wavy or uneven contour after being deposited (not shown). Referring to FIG. 7L, the upper surface 292 of the third sacrificial layer 244 may then be planarized in an appropriate manner, such as by chemical polishing, to yield a sufficiently flat upper surface 292 of the second sacrificial layer 244, but one which still has a sufficient thickness over the posts 284, 286.

The second sacrificial layer 244 is then patterned to define third and fourth post receptacles 271, 273, as illustrated in FIG. 7M. A third bottom surface 275 of the third post receptacle 271 is defined by the first post 284. Similarly, a fourth bottom surface 277 of the fourth post receptacle 273 is defined by the second post 286. In addition, walls 294 of the third and fourth post receptacles 271, 273 are defined by the second sacrificial layer 244. Thus, at a minimum, these third and fourth post receptacles 271, 273 allow for establishing a structural interconnection with the respective first and second posts 284, 286. Accordingly, this patterning of the third and fourth post receptacles 271, 273 generally includes etching entirely through the second sacrificial layer 244 to the first and second posts 284, 286. In any case, the third and fourth post receptacles 271, 273 are preferably positioned directly above (i.e., vertically aligned with) the corresponding first and second posts 284, 286, although the portions of the first and second posts 284, 286, which are exposed by respective third and fourth post receptacles 271, 273, will typically have a slightly larger diameter than their corresponding post receptacles 271, 273.

Referring now to FIG. 7N, a third structural layer 248 is formed over the second sacrificial layer 244. Structural material of this third structural layer 248 is deposited within the third and fourth post receptacles 271, 273 to form respective third and fourth posts 285, 287. In other words, the structural material that defines the third structural layer 248 is also deposited within and at least substantially fills the third and fourth post receptacles 271, 273 that were previously formed in the second sacrificial layer 244, and such may be characterized as being part of the third structural layer 248. Although FIG. 7N shows a definitive intersection line between the first and third posts 284, 285, as well as between the second and fourth posts 286, 287, typically such an intersection will not exist and instead will at least appear to be continuous structures.

As a result of depositing/forming the third structural layer 248, depressions 298 may appear on a superior surface 279 of the third structural layer 248 generally in vertical alignment with where the structural material occupies the respective third and fourth post receptacles 271, 273. Turning to FIG. 7O, this third structural layer 248 is then patterned to have the third and fourth posts 285, 287 generally coinciding with the shape, design, and configuration of the third and fourth post receptacles 271, 273, respectively. In addition, the third structural layer 248 is at the same time patterned to have a bridge beam or jumper 296 extending between and interconnecting the third and fourth posts 285, 287. Since the depressions 298 exist on the upper surface of the third structural layer 248 over what was once the post receptacles 271, 273, it may be desirable to planarize the upper surface of the third structural layer 248 before patterning the same to define the posts 285, 287 and the jumper 296. The resulting configuration of such a planarization is presented in FIG. 7P. In any case, a jump connector or bridge of the first die 230 is thus defined by the combined structure of the first, second, third, and fourth posts 284, 286, 285, 287, and the jumper 296. This completes the definition of the jump connector or bridge structure 300. It should be appreciated that a system that includes the bridge structure 300 will likely include other microstructural components than those illustrated in the fabrication method of FIGS. 7A–7Q. It should also be appreciated that the method illustrated in FIG. 7A–7Q may include some variational embodiments. For example, one variational embodiment may include the first sacrificial layer 228 being deposited to exhibit an appropriate thickness and then planarized and patterned. Subsequently, an entire bridge structure may then be made from a deposition and patterning of the second structural layer 238, thus making a bridge structure without using the second sacrificial layer 244 and third structural layer 248 in this variation of the fabrication process.

FIG. 7P also shows, as a first option, that the first die 230 may be separated from the second die 232 to define a chip, such as by sawing at least at the die boundary 226. This separation of the first die 230 from the second die 232 generally includes cutting through an entirety of whatever layers/materials are positioned at the die boundary 226, in this case, the first structural layer 224, the dielectric layer 220, the first substrate 212, the first sacrificial layer 228, and the second sacrificial layer 244. This separation step generally exposes a die edge 231. This die edge 231 is generally devoid of exposed oxide material from the first oxide layer 216 between the dielectric layer 220 and the first substrate 212. Thereafter, the chip may be exposed to a release etchant to remove sacrificial layers in the system. Specifically, and referring to FIG. 7Q, the first die 230 is exposed to a release etchant which removes the exposed sacrificial material of any of the sacrificial layers, including the sacrificial layers 228, 244. However, none of the first oxide layer 216 is etched away at the edge 231 of the first die 230 due to the first sacrificial layer 216 not being exposed at the edge 231.

Another option would be to include both the first die 230 and the second die 232 in a chip. In this case, it should be appreciated that the above-described structure would allow an appropriate electrical signal to be transferred between the first die 230 and the second die 232 using the pair of jump connectors 300 between the first die 230 and the second die 232.

Those skilled in the art will now see that certain modifications can be made to the apparatus and methods herein disclosed with respect to the illustrated embodiments, without departing from the spirit of the instant invention. And while the invention has been described above with respect to the preferred embodiments, it will be understood that the invention is adapted to numerous rearrangements, modifications, and alterations, and all such arrangements, modifications, and alterations are intended to be within the scope of the appended claims.

What is claimed:

1. A method for making a chip, comprising the steps of:
   forming a first oxide layer over a substrate;
   forming a first die boundary channel in said first oxide layer that extends completely through said first oxide layer and to said substrate;
   forming a dielectric layer over said first oxide layer and within at least a lower portion of said first die boundary channel;
   defining first and second die on opposite sides of a first die boundary, wherein said first die boundary extends along at least a portion of said first die boundary channel after both have been formed, wherein each of said first and second die cornprises a microelectromechanical assembly, and wherein each of said first and second die corresponds with one field of a photolithographic stepper;
   forming a die boundary channel electrical trace on a portion of said dielectric layer that is within said first die boundary channel, wherein said die boundary channel electrical trace is electrically interconnected with said microelectromechanical assembly of said first die, and wherein said die boundary channel electrical trace is also electrically interconnected with said microelectromechanical assembly of said second die; and
   separating said first die from said second die, wherein at least part of said separating step is along at least a portion of said first die boundary channel, wherein said separating step severs said die boundary channel electrical trace into a first portion that is associated with said first die and a second portion that is associated with said second die and such that said first and second die are no longer electrically interconnected.

2. A method, as claimed in claim 1, wherein said forming a first die boundary channel step comprises removing a portion of said first oxide layer down to said substrate.

3. A method, as claimed in claim 1, wherein said forming a first die boundary channel step comprises defining first and second sidewalls of said first die boundary channel with first and second edge surfaces, respectively, of said first oxide layer.

4. A method, as claimed in claim 3, wherein said first and second edge surfaces of said first oxide layer are separated by a distance within a range of about 50 microns to about 300 microns.

5. A method, as claimed in claim 3, wherein said first and second edge surfaces of said first oxide layer are disposed in at least generally parallel relation.

6. A method, as claimed in claim 3, wherein said forming a dielectric layer step comprises coating said first and second edge surfaces of said first oxide layer with a dielectric material.

7. A method, as claimed in claim 1, wherein said forming a first die boundary channel step comprises defining a closed perimeter for said first die boundary channel, wherein said first die is surrounded by said first die boundary channel.

8. A method, as claimed in claim 1, wherein said forming a dielectric layer step comprises filling only a lower portion of said first die boundary channel with a dielectric material.

9. A method, as claimed in claim 1, wherein said forming a dielectric layer step comprises protecting said first oxide layer from exposure to a release etchant to which said chip is exposed after said separating step.

10. A method, as claimed in claim 1, wherein said defining first and second die step comprises using a field stepper.

11. A method, as claimed in claim 1, wherein:
    said defining first and second die step comprises forming an identical said microelectromechanical assembly on each of said first and second die.

12. A method, as claimed in claim 11, wherein said defining first and second die step comprises forming all microstructures of said microelectromechanical assembly for each of said first and second die outside of said first die boundary channel.

13. A method, as claimed in claim 1, wherein said separating step comprises sawing at least generally along said at least a portion of said first die boundary channel.

14. A method, as claimed in claim 1, further comprising the steps of forming a first electrical trace that is associated with said first die and that is electrically interconnected with said die boundary channel electrical trace, forming a second electrical trace that is associated with said second die and that is electrically interconnected with said die boundary channel electrical trace, and forming a separate shield over each of said first and second electrical traces such that said separating step fails to pass through any portion of any said shield.

15. A method, as claimed in claim 14, wherein said separating step defines a first edge of said chip, wherein each said shield is separated from said first edge by a distance of at least about 25 microns.

16. A method, as claimed in claim 1, wherein said defining first and second die step comprises forming a first electrical trace for said first die that is located out of said first die boundary channel, forming a second electrical trace for said second die that is located out of said first die boundary channel, forming a first jump connection between said first electrical trace and said die boundary channel electrical trace, and forming a second jump connection between said second electrical trace and said die boundary channel electrical trace.

17. A method, as claimed in claim 16, wherein said first die boundary channel comprises a base and first and second sidewalls that are each defined by a dielectric material after said forming a dielectric layer step, wherein said die boundary channel electrical trace terminates prior to reaching said first sidewall of said first die boundary channel and also terminates prior to reaching said second sidewall of said first die boundary channel, wherein said first jump connection is disposed beyond an upper end of said first sidewall, and wherein said second jump connection is disposed beyond an upper end of said second sidewall.

18. A method for fabricating a chip, comprising the steps of:
    forming a first oxide layer over a substrate;
    forming a first die boundary channel in said first oxide layer that extends down through said first oxide layer and to said substrate;

forming a dielectric layer over said first oxide layer and within at least a lower portion of said first die boundary channel;

defining first and second die on opposite sides of at least a portion of said first die boundary channel, wherein each said die comprises a microelectromechanical assembly, wherein said defining first and second die step comprises forming at least one electrical trace that extends across said at least a portion of said first die boundary channel directly on said dielectric layer;

separating said first die from said second die at least along a portion of said first die boundary channel; and forming a shield over only a portion of each said electrical trace such that said separating step fails to pass through any portion of any said shield.

19. A method, as claimed in claim 18, wherein said separating step defines a first edge of said chip, wherein each said shield is separated from said first edge by a distance of at least about 25 microns.

20. A method for fabricating a chip, comprising the steps of:

forming a first oxide layer over a substrate;

forming a first die boundary channel in said first oxide layer that extends down through said first oxide layer and to said substrate;

forming a dielectric layer over said first oxide layer and within at least a lower portion of said first die boundary channel;

defining first and second die on opposite sides of at least a portion of said first die boundary channel, wherein each said die comprises a microelectromechanical assembly, wherein said defining first and second die step comprises forming a first electrical trace for said first die that is located out of said first die boundary channel, forming a second electrical trace for said second die that is located out of said first die boundary channel, forming a third electrical trace on said dielectric layer within said first die boundary channel, forming a first jump connection between said first and third electrical traces, and forming a second jump connection between said second and third electrical traces, wherein a first portion of said third electrical trace is associated with said first die and a second portion of said third electrical trace is associated with said second die, and wherein ends of said first and second portions of said third electrical trace are merged together; and separating said first die from said second die at least along a portion of said first die boundary channel.

21. A method, as claimed in claim 20, wherein said forming a dielectric layer step comprises forming a second die boundary channel within said first die boundary channel, wherein said second die boundary channel comprises a base and first and second sidewalls that are defined by a dielectric material, wherein said third electrical trace terminates prior to reaching said first sidewall of said second die boundary channel and prior to reaching said second sidewall of said second die boundary channel.

* * * * *

UNITED STATES PATENT AND TRADEMARK OFFICE
CERTIFICATE OF CORRECTION

PATENT NO. : 6,989,582 B2
DATED : January 24, 2006
INVENTOR(S) : Sniegowski et al.

It is certified that error appears in the above-identified patent and that said Letters Patent is hereby corrected as shown below:

Column 21,
Line 29, delete "cornprises" and insert -- comprises --.

Signed and Sealed this

Fourth Day of April, 2006

JON W. DUDAS
*Director of the United States Patent and Trademark Office*